United States Patent
Hida et al.

(10) Patent No.: US 9,189,323 B2
(45) Date of Patent: Nov. 17, 2015

(54) SEMICONDUCTOR STORAGE DEVICE AND METHOD OF CONTROLLING THE SAME

(75) Inventors: Toshikatsu Hida, Kanagawa (JP); Takashi Oshima, Chiba (JP); Kouji Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 182 days.

(21) Appl. No.: 13/820,159

(22) PCT Filed: Dec. 15, 2011

(86) PCT No.: PCT/JP2011/079755
§ 371 (c)(1),
(2), (4) Date: Mar. 1, 2013

(87) PCT Pub. No.: WO2012/081732
PCT Pub. Date: Jun. 21, 2012

(65) Prior Publication Data
US 2013/0179750 A1  Jul. 11, 2013

(30) Foreign Application Priority Data
Dec. 15, 2010  (JP) .................................. 2010-279074

(51) Int. Cl.
*G11C 29/00* (2006.01)
*G06F 11/10* (2006.01)
(Continued)

(52) U.S. Cl.
CPC ............... *G06F 11/10* (2013.01); *G06F 11/08* (2013.01); *G06F 11/1044* (2013.01); *H03M 13/152* (2013.01); *H03M 13/1515* (2013.01); *H03M 13/2906* (2013.01); *H03M 13/2927* (2013.01); *H03M 13/3723* (2013.01); *G06F 11/1004* (2013.01); *G06F 11/108* (2013.01);
(Continued)

(58) Field of Classification Search
CPC .............................. G06F 11/08; G06F 11/1004
USPC ....................................................... 714/763, 773
See application file for complete search history.

(56) References Cited

U.S. PATENT DOCUMENTS 6,461,916 B1  10/2002  Adachi et al.
8,086,933 B2  12/2011  Yamaga
(Continued)

FOREIGN PATENT DOCUMENTS

EP      0 426 271 B1      9/1995
JP      2007 305105        11/2007
(Continued)

OTHER PUBLICATIONS

Office Action issued Sep. 2, 2014, in Japanese Patent Application No. 2010-279074 with English translation.
(Continued)

*Primary Examiner* — M. Mujtaba K Chaudry
(74) *Attorney, Agent, or Firm* — Oblon, McClelland, Maier & Neustadt, L.L.P.

(57) ABSTRACT

According to one embodiment, a semiconductor storage device includes a nonvolatile semiconductor memory, a temporary storage buffer that temporarily stores writing data to be written to the nonvolatile semiconductor memory, and a coding processing unit that divides coding target data of an error correction code into two or more divided data and writes an error correction code obtained by performing an error correction coding process based on the divided data stored in the temporary storage buffer to the temporary storage buffer as an intermediate code.

18 Claims, 31 Drawing Sheets

(51) Int. Cl.
*G06F 11/08* (2006.01)
*H03M 13/15* (2006.01)
*H03M 13/29* (2006.01)
*H03M 13/37* (2006.01)
*H04L 29/08* (2006.01)
*G11C 29/04* (2006.01)
*H03M 13/09* (2006.01)

(52) U.S. Cl.
CPC ....... *G11C2029/0411* (2013.01); *H03M 13/09* (2013.01); *H04L 67/1097* (2013.01)

(56) References Cited

U.S. PATENT DOCUMENTS

| | | |
|---|---|---|
| 2007/0237007 A1 | 10/2007 | Muraoka |
| 2009/0049364 A1* | 2/2009 | Jo et al. .......................... 714/763 |
| 2010/0064200 A1* | 3/2010 | Choi et al. .................... 714/773 |
| 2010/0077280 A1 | 3/2010 | Ootsuka |
| 2010/0161885 A1 | 6/2010 | Kanno et al. |
| 2010/0287446 A1* | 11/2010 | Post et al. .................... 714/763 |
| 2010/0313102 A1* | 12/2010 | Chen et al. .................... 714/773 |
| 2010/0332951 A1* | 12/2010 | Peng et al. .................... 714/773 |
| 2011/0239081 A1 | 9/2011 | Hida et al. |
| 2012/0072811 A1 | 3/2012 | Fukutomi et al. |
| 2012/0166908 A1 | 6/2012 | Yamaga |

FOREIGN PATENT DOCUMENTS

| | | |
|---|---|---|
| JP | 2009 211209 | 9/2009 |
| JP | 2010 97600 | 4/2010 |
| TW | 201027555 A1 | 7/2010 |
| WO | WO 98/44567 A1 | 10/1998 |

OTHER PUBLICATIONS

Patterson, D. et al., "A Case for Redundant Arrays of Inexpensive Disks (RAID)," Computer Science Division, Department of Electrical Engineering and Computer Sciences, UC Berkeley Technical Report, UCB/CSD-87-391, Total 25 pages, (1989).

Plank, J., "A Tutorial on Reed-Solomon Coding for Fault-Tolerance in RAID-like Systems," Department of Computer Science, University of Tennessee, Technical Report CS-96-332, Total 19 pages, (Feb. 19, 1999).

Patterson, D. et al., "A Case for Redundant Arrays of Inexpensive Disks (RAID)," Computer Science Division, Department of Electrical Engineering and Computer Sciences, Proceedings of the 1988 ACM SIGMOD, Total 8 pages, (Jun. 1988).

International Search Report Issued Mar. 19, 2012 in PCT/JP11/79755 Filed Dec. 15, 2011.

Combined Taiwanese Office Action and Search Report issued Feb. 8, 2014 in Patent Application No. 100146709 with English Translation and English Translation of Category of Cited Documents.

\* cited by examiner

FIG.12

CORRESPONDENCE TABLE

CORRESPONDENCE BETWEEN TWO AREAS (POSITIONS OF DATA 208 AND 209) AND POSITION OF CODE #0

SEMICONDUCTOR STORAGE DEVICE AND METHOD OF CONTROLLING THE SAME

CROSS-REFERENCE TO RELATED APPLICATIONS

This application is based upon and claims the benefit of priority from Japanese Patent Application No. 2010-279074, filed on Dec. 15, 2010; the entire contents of which are incorporated herein by reference.

FIELD

Embodiments described herein relate generally to a semiconductor storage device and a method of controlling the same.

BACKGROUND

In a semiconductor storage device that stores information using a nonvolatile semiconductor memory, an error is likely to occur in data due to aging. Thus, in such a semiconductor storage device, an error correction coding process is performed so that an error can be corrected even when a data error occurs.

BRIEF DESCRIPTION OF DRAWINGS

FIG. 12 is a diagram showing an example of a code writing operation during flashing.

DETAILED DESCRIPTION

In general, according to one embodiment, a semiconductor storage device includes a nonvolatile semiconductor memory, a temporary storage buffer that temporarily stores writing data to be written to the nonvolatile semiconductor memory. The semiconductor storage includes a coding processing unit that divides coding target data of an error correction code into two or more divided data and writes an error correction code obtained by performing an error correction coding process based on the divided data stored in the temporary storage buffer to the temporary storage buffer as an intermediate code.

When correcting errors using an error correction code, not only correction capability but also the amount of redundant codes (error correction codes) determined by the correction capability is an important factor in deciding which error correction coding process will be performed. In particular, in the field of storage, the amount of redundant information is the most important factor since an increase in the amount directly leads to an increase in cost.

In general, in commonly used error correction codes such as BCH codes, if the total amount of redundant codes and data in a semiconductor memory is fixed, it is possible to increase the error correction capability by increasing an error correction unit (by increasing the length of data and code) since the possibility to correct errors increases even when errors occur in a biased manner. Conversely, if the error correction capability is fixed, since the amount of redundant codes can be decreased by increasing an error correction unit, there is a possibility to maintain the error correction capability while preventing an increase in the cost of semiconductor memories.

On the other hand, in order to deal with failures occurring in units of blocks or memory chips, it may be effective to calculate an error correction code based on data which are recorded so as to be distributed over a plurality of blocks or a plurality of memory chips. When a NAND memory is used as a nonvolatile semiconductor memory, data are written to the NAND memory in the order of pages. In this case, if an error correction code having a large code length is calculated based on data which are recorded so as to be distributed over a plurality of blocks or a plurality of memory chips, there may be a large number of blocks or the like having a non-written area. Thus, there is a problem in that the efficiency in the use of a semiconductor memory decreases.

Exemplary embodiments of a semiconductor storage device and a method of controlling the same will be explained below in detail with reference to the accompanying drawings. The present invention is not limited to the following embodiments.

First Embodiment

Figure 1:
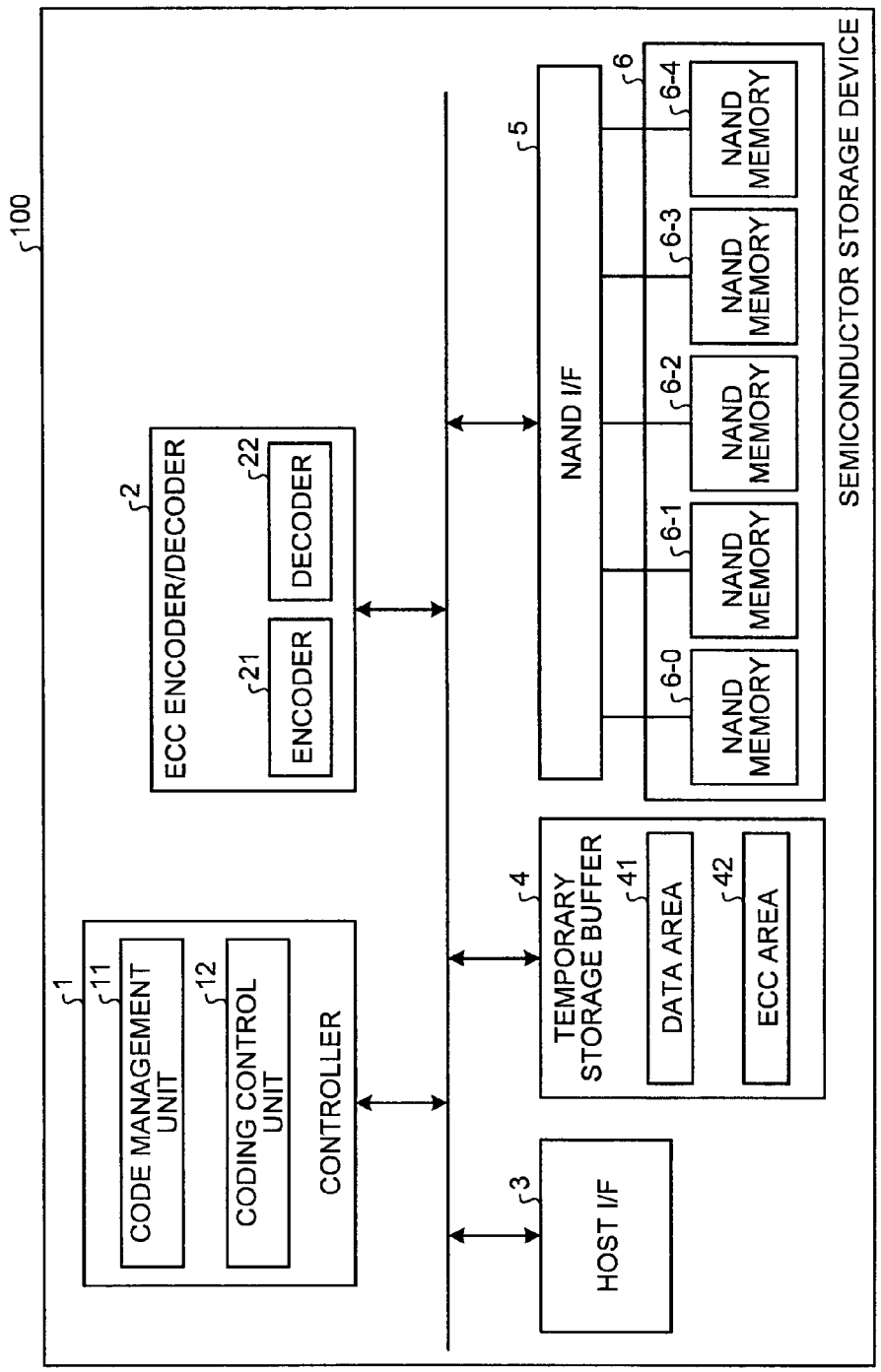
FIG. 1 is a block diagram showing a configuration example of a semiconductor storage device according to a first embodiment.

FIG. 1 is a block diagram showing a configuration example of a semiconductor storage device 100 according to the first embodiment. The semiconductor storage device (Solid State Drive: SSD) 100 of the present embodiment includes a semiconductor memory that stores data in a nonvolatile manner. In the present embodiment, although an example in which the semiconductor storage device 100 is a SSD is described, the present embodiment can be applied is not limited to the SSD. For example, the present embodiment can be applied to an auxiliary storage device such as a memory card which includes a semiconductor memory storing data in a nonvolatile manner and a controller.

Each functional block in each embodiment can be implemented by any one of hardware and software, or a combination of both. Therefore, each functional block will be described below from the viewpoint of its function in order to clearly show that the block can be one or both of hardware and software. Whether such a function is implemented as hardware or software depends on a practical embodiment or design limitations imposed on the whole system. Although those skilled in the art can implement these functions by various methods for each practical embodiment, the scope of the invention includes determination of the implementation.

The semiconductor storage device 100 is connected to a host device such as a personal computer through a host interface (host I/F) 3 and functions as an external storage device of the host device. The semiconductor storage device 100 includes a controller (control unit) 1, an error check and correct (ECC) encoder/decoder 2, the host I/F 3, a temporary storage buffer 4, a NAND interface (NAND I/F) 5, and a NAND memory 6.

The host I/F 3 includes a communication interface of an advanced technology attachment (ATA) standard, for example, and controls communication between the semiconductor storage device 100 and the host device in accordance with the control of the controller 1. The host I/F 3 receives a command transmitted from the host device and sends the command (write command) to the controller 1 when the command requests writing of data of which the logical address (Logical Block Addressing: LBA) is designated. Moreover, when receiving, from the host device, a command requesting reading of data which are stored in the NAND memory 6, the host I/F 3 sends the command (read command) to the controller 1.

The controller 1 performs various controls such as control of data transfer between the semiconductor storage device 1 and the host device, control of data writing to the NAND memory 6, and control of data reading from the NAND memory 6. The controller 1 includes a code management unit 11 that controls writing and reading of data to/from the NAND memory 6 and manages correspondence between error correction codes and data written to the NAND memory 6, and a coding control unit 12 that controls an error correction coding process on data written to the NAND memory 6 and a decoding process on data read from the NAND memory 6. The controller 1 manages correspondence relationship and the like between a logical address (LBA) as a logical address designated by the host device, a storage position on the NAND memory 6, and a storage position on the NAND memory 6 of an error correction code corresponding to data written to the NAND memory 6.

The temporary storage buffer 4 includes a data area 41 and an ECC area 42. The data area 41 is used for temporarily storing data to be transferred by the controller 1. The ECC area 42 stores error correction codes generated by the ECC encoder/decoder 2. The temporary storage buffer 4 is configured as a volatile memory such as, for example, a dynamic random access memory (DRAM) or a static random access memory (SRAM).

The error check and correct (ECC) encoder/decoder 2 includes an encoder (coding processing unit) 21 and a decoder (decoding processing unit) 22. The encoder 21 performs an error correction coding process on data to be written to the NAND memory 6, stored in the data area 41 in the temporary storage buffer 4. The decoder 22 performs a decoding process on data stored in the NAND memory 6 based on an error correction code corresponding to the data.

The NAND I/F 5 is a memory interface that executes control of data transfer between NAND memories 6-0 to 6-4(6s) and the temporary storage buffer 4, and includes four channels (channels ch0 to ch4) so that reading and writing can be performed in parallel. The channels ch0 to ch4 control the corresponding NAND memories 6-0 to 6-4, respectively.

The NAND memory 6 is a semiconductor memory and includes NAND memories 6-0 to 6-4. Among the NAND memories 6-0 to 6-4, NAND memories 6-0 to 6-3 are data storage memories to which data transferred from the host device are written, and a NAND memory 6-4 is a code memory to which error correction codes generated by the ECC encoder/decoder 2 are written. In the present embodiment, although a code channel and a code memory area (the NAND memory 6-4) are provided separately from a data channel and a data memory area, error correction codes may be stored in a data storage area of the NAND memory 6 without providing a dedicated code channel and a dedicated code memory area.

Data transferred from the host device are temporarily stored in the data area 41 of the temporary storage buffer 4 through the host I/F 3 under the control of the controller 1. After that, the data are read from the temporary storage buffer 4 and written to the NAND memory 6 through the NAND I/F 5. Data read from the NAND memory 6 are temporarily stored in the data area 41 of the temporary storage buffer 4 through the NAND I/F 5. After that, the data are read from the temporary storage buffer 4 and transferred to the host device through the host I/F 3.

The NAND memory 6 includes a memory cell array in which a plurality of memory cells are arranged in a matrix form. Individual memory cells may be memory cells capable of storing multiple values and may be memory cells in which each cell is capable of one value. It is assumed that the NAND memories 6-0 to 6-4 each are configured as one memory chip. Moreover, each memory chip (the NAND memories 6-0 to 6-4 each) includes at least one block which is the unit of data erasure. One block includes at least one page. One page includes a plurality of memory cells, and writing and reading of data to/from the NAND memory 6 are performed in units of pages. Moreover, writing of data to the NAND memory 6 is performed in ascending order of pages.

Figure 2:
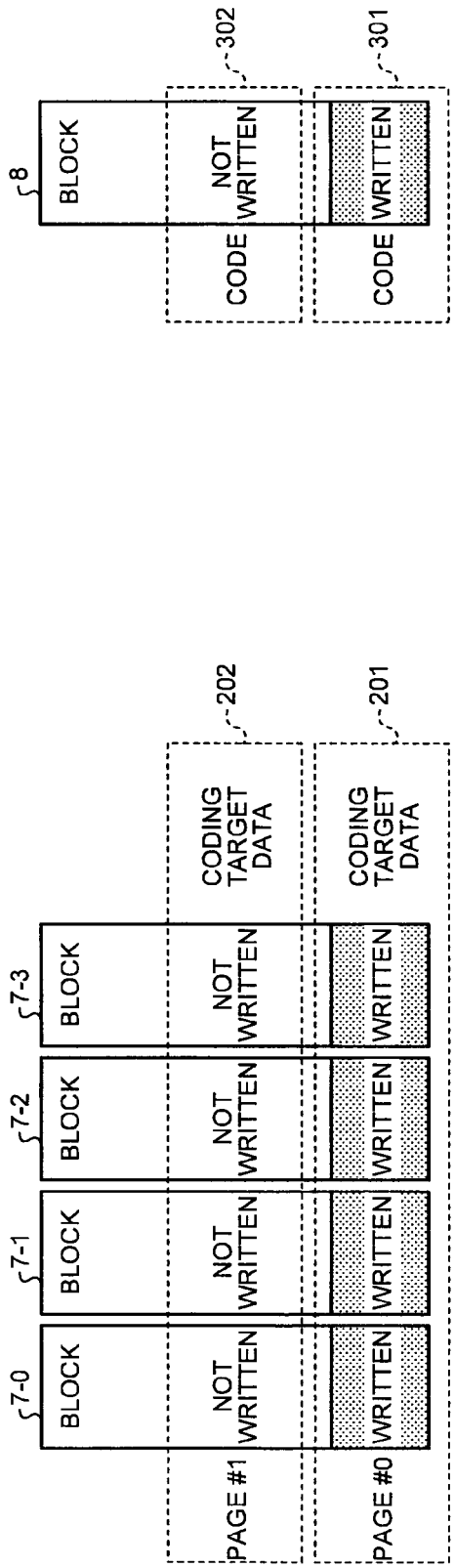
FIG. 2 is a diagram showing an example of correspondence between coding target data and error correction codes.
Figure 3:
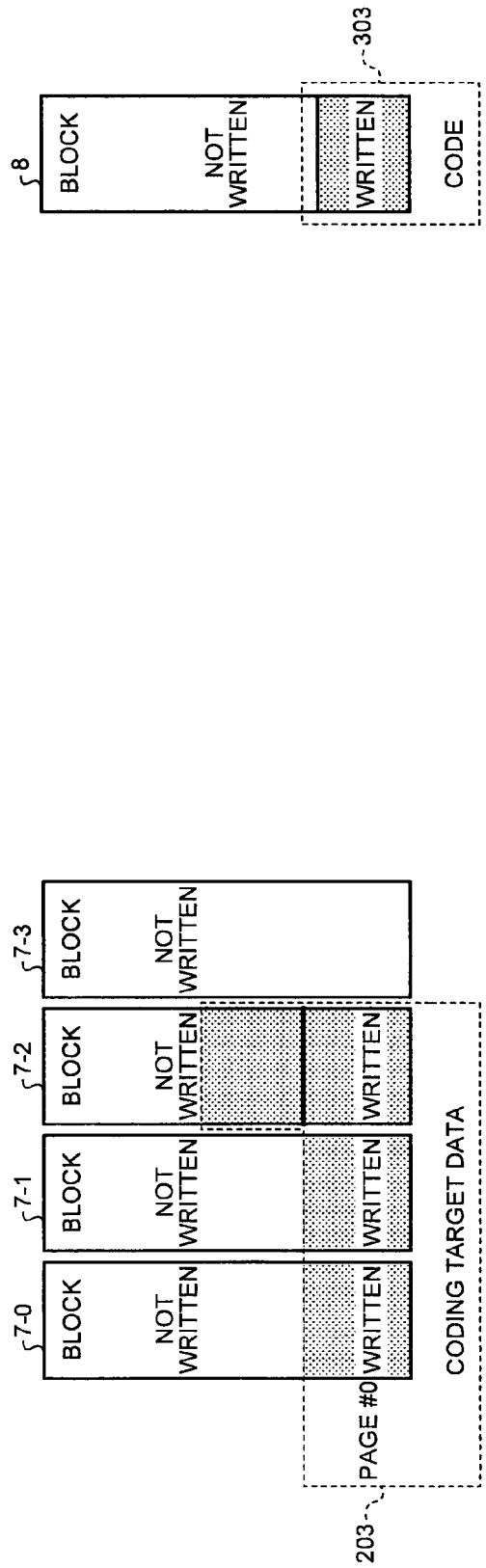
FIG. 3 is a diagram showing an example of correspondence between coding target data and error correction codes.

Next, an error correction coding process according to the present embodiment will be described. FIGS. 2 and 3 are diagrams showing an example of the correspondence between coding target data and error correction codes. FIGS. 2 and 3 show an example in which an error correction code is generated using data of one page for each block of the NAND memory 6 as coding target data. FIGS. 2 and 3 show an example in which the ratio of data to code is 4:1. A block 7-0 shown in FIGS. 2 and 3 is a block in the NAND memory 6-0, in which reading and writing of data are performed by the channel ch0, and similarly, blocks 7-1, 7-2, and 7-3 are blocks in the NAND memories 6-1, 6-2, and 6-3, in which reading and writing of data are performed by the channels ch1, ch2, and ch3, respectively. A block 8 is a block in the NAND memory 6-4 which is a code memory in which reading and writing of data are performed by the channel ch4.

When generating one error correction code using data of one page in each of the four blocks, for example, data written to a page #0 of the blocks 7-0 to 7-3 are used as coding target data 201 as shown in FIG. 2. Then the encoder 21 of the ECC encoder/decoder 2 generates an error correction code based on the coding target data 201. The generated error correction code is written to the block 8 as a code (error correction code) 301. Similarly, an error correction code generated based on coding target data 202, which are written to a page #1 of the blocks 7-0 to 7-3, is written to the block 8 as a code 302. FIG. 2 shows a state in which writing of data to the NAND memory 6 is completed for the page #0, whereas writing of data to the NAND memory 6 is not completed for the page #1.

When data are selected in accordance with a coding target data selection method (a method of selecting data of one page from each block) shown in FIG. 2, and an error correction code capable of correcting the data of one page is used, it is possible to correct data even when a block failure occurs. Specifically, when an error correction code capable of correcting data of one page is used, even when a failure occurs in any of the four blocks, it is possible to recover data of the fault block in units of pages by using the error correction code generated for each page. The error correction code capable of correcting data of one page may be replaced by a method of recovering data of one page by combining error correction codes capable of correcting a smaller number of data than the data of one page similarly to the method of recovering data of one block by combining error correction codes capable of correcting data of one page.

FIG. 3 shows a case in which the ratio of data to code is 4:1 similarly to FIG. 2, but differently from FIG. 2, coding target data 203 corresponding to one error correction code are selected redundantly from a certain block (block 7-2) to thereby generate the corresponding code 303. In this case, when a failure occurs in the block 7-2, it is necessary to correct data of two pages. Thus, even when the code has an error correction capability to correct data of one page, it may not be possible to correct data, and data of one block cannot be recovered.

From the above, when the ratio of data to code is the same, and the error correction capability is the same, in order to deal with block failures, as in the example of FIG. 2, it is desirable to a number of select coding target data corresponding to the number of correctable pages or smaller from each block. For example, when an error correction code is capable of correcting two pages as in the case of FIG. 3, data of two pages may be selected from one block and used as coding target data.

Figure 4:
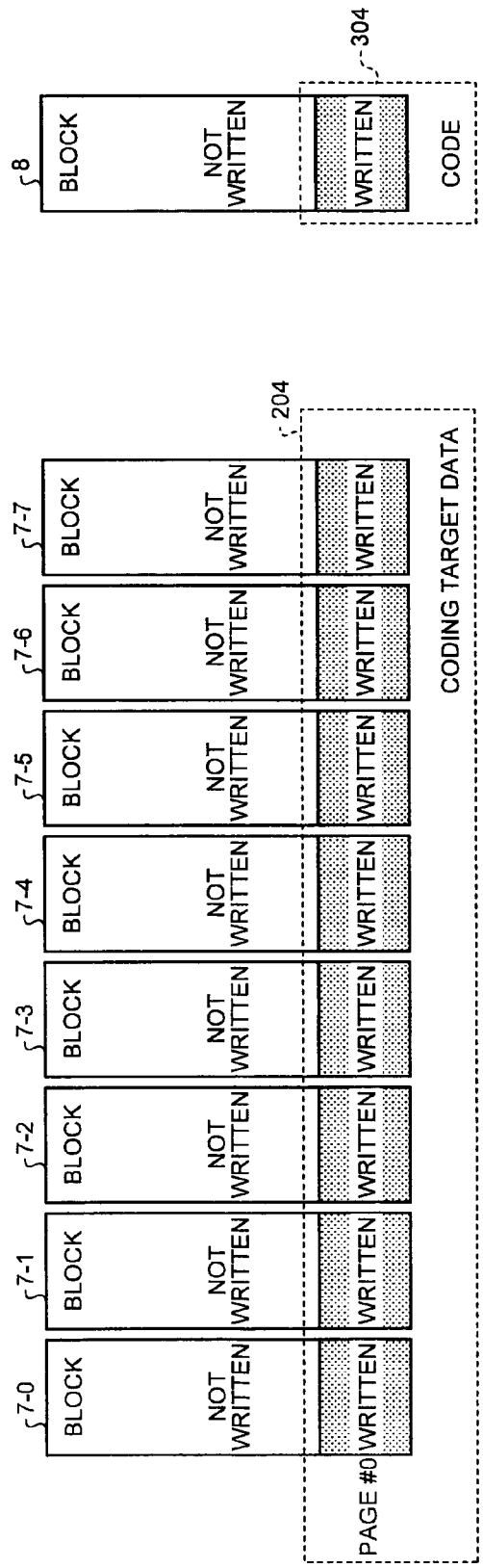
FIG. 4 is a diagram showing an example of correspondence between coding target data and error correction codes when the ratio of data to code is 8:1.

FIG. 4 shows an example of the correspondence between coding target data and error correction codes when the ratio of data to code is 8:1. In the example of FIG. 4, data of one page are selected from each block similarly to the example of FIG. 2 as coding target data 204 corresponding to a code 304. In this example, since there are four data channels, when the ratio of data to code is 8:1, data are selected from each two blocks corresponding to each channel as the coding target data 204. For example, it is assumed that blocks 7-0 and 7-4 are controlled by the channel ch0, blocks 7-1 and 7-5 are controlled by the channel ch2, blocks 7-2 and 7-6 are controlled by the channel ch2, and blocks 7-3 and 7-7 are controlled by the channel ch3. Although the correspondence between channels and blocks is not limited to this, it is desirable that the coding target data corresponding to one error signal are selected so as not to be concentrated on a particular channel taking the efficiency of parallel reading and writing into consideration.

While an example of the correspondence between coding target data and error correction codes stored in the NAND memory 6 has been described by way of an example of recovering data of one block, the ratio of data to code, the correction capability, and the corresponding failure mode are not limited to the example described above.

Figure 5:
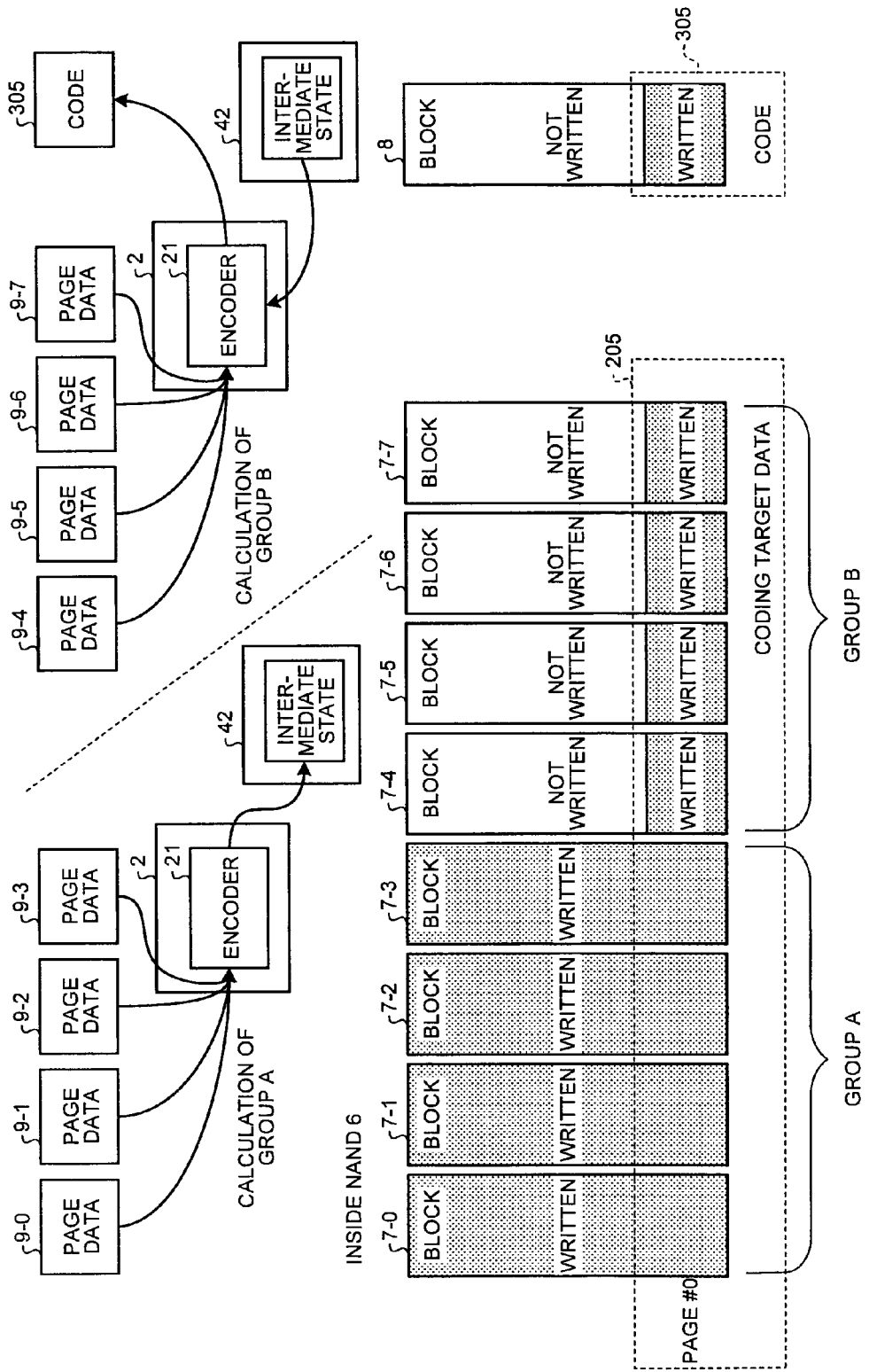
FIG. 5 is a diagram showing an example of a method of recording the intermediate states of error correction codes according to the first embodiment.

Next, recording of the intermediate states (intermediate codes) of error correction codes according to the present embodiment will be described. FIG. 5 is a diagram showing an example of a method of recording the intermediate states of error correction codes according to the present embodiment. FIG. 5 shows an example in which the ratio of data to code is 8:1. In the example of FIG. 5, as shown in the lower part of FIG. 5, a code 305 which is an error correction code generated based on coding target data 205 which are data of eight blocks is stored in the block 8 similarly to the example of FIG. 4.

On the other hand, in the example of FIG. 5, when generating an error correction code stored in the NAND memory 6 based on the data (page data) stored in the blocks 7-0 to 7-7, the encoder 21 of the ECC encoder/decoder 2 first performs a process of generating an error correction code based on page data 9-0 to 9-3 stored in the blocks 7-0 to 7-3 as shown in the upper part of FIG. 5. The encoder 21 stores the result of the error correction code generation process based on the page data 9-0 to 9-3 in the ECC area 42 of the temporary storage buffer 4 as an intermediate state of an error correction code. Moreover, the encoder 21 stores the result of the error correction code generation process based on page data of the next page stored in the blocks 7-0 to 7-3 in the ECC area 42 of the temporary storage buffer 4 as an intermediate state of an error correction code.

Groups are defined as the blocks 7-0 to 7-3 makes a group A and the block 7-0 to 7-3 makes a group B. The encoder 21 stores the intermediate state of the error correction code of all pages in each block of the group A in the ECC area 42, and then starts the error correction code generation process based on the page data 9-4 to 9-7 stored in the blocks 7-4 to 7-7 of the group B. When processing the page data 9-4 to 9-7 stored in the blocks 7-4 to 7-7 of the group B, the encoder 21 reads the intermediate state of the group A corresponding to the same pages stored in the ECC area 42. Then, the encoder 21 generates an error correction code (that is, a completed error correction code) to be stored in the NAND memory 6 based on the intermediate state and the page data 9-4 to 9-7. In this way, by inputting the data of the group B using the intermediate state of the error correction code of the group A as the initial value and performing the error correction coding process, an error correction code corresponding to both data of the groups A and B as a whole is generated. In a manner similar to the above with respect to subsequent pages, error correction codes are sequentially generated based on the intermediate state and the page data of the respective blocks of the group B.

In the present embodiment, as described above, the intermediate state of the error correction code under processing is stored (saved) in the temporary storage buffer 4, and the saved intermediate state is read (restored) when performing the error correction code generation process using the remaining blocks, whereby writing of data to the group B can be performed after writing data to all blocks of the group A as shown in FIG. 5. The NAND memory is a device in which data need to be written in the order of pages. When generating an error correction code using data distributed over a plurality of blocks, in a method of related art which does not store an intermediate state, since coding target data of an error correction code are stored in the order of pages, the efficiency in the use of blocks decreases. In contrast, in the present embodiment, since writing of data to the group B can be performed after writing data to all blocks of the group A, it is possible to improve the efficiency in the use of blocks as compared to the method of related art which does not store an intermediate state.

Although FIG. 5 shows an example in which the intermediate state is stored once (in the temporary storage buffer 4) with respect to one complete (final) error correction code, the intermediate state may be stored several times, for example, when a complete error correction code is generated based on the data of 12 blocks. For example, when one complete error correction code is generated using the data of the page #0 of blocks 7-0 to 7-11, each four blocks may be grouped as three groups A, B, and C. When generating an error correction code of the group C, the error correction code up to the group B in the example of FIG. 5 may be restored as the intermediate state, and a complete error correction code may be generated based on the intermediate state and the data of the group C. Although in this example, the blocks are grouped for the sake of convenience, the grouping is not essential. The intermediate state may be generated in any units as long as the results of an error correction coding process which involves inputting a part of the coding target data of a complete error correction code as the intermediate state in the course of the process of generating the complete error correction code are stored and restored. For example, the number of data for which the intermediate state is input may be different for each page in the example of FIG. 5. There is no limitation in the method of selecting the coding target data of an error correction code. For example, the error correction code may be generated based on only the data of one block, and the error correction code may be generated based on the data of five blocks.

Figure 6:
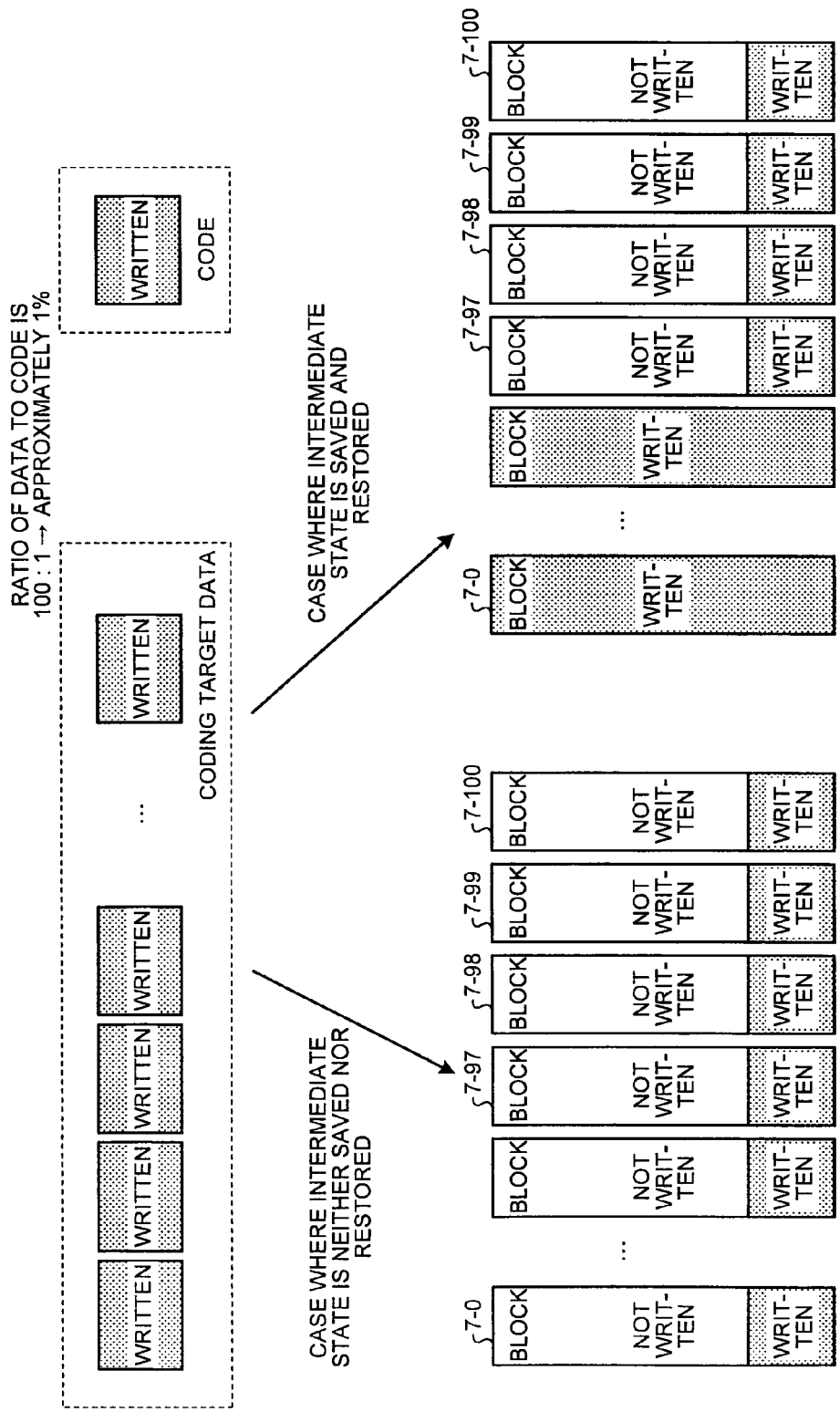
FIG. 6 is a diagram illustrating the effects of the first embodiment.

FIG. 6 is a diagram illustrating the effects of the present embodiment. FIG. 6 shows an example in which a code length (data+code) is set to be long in order to decrease the amount of codes. Specifically, FIG. 6 shows an example in which the ratio of data to code is 100:1 (the ratio of "code" to "code and data" is approximately 1%) as an example. Blocks 7-0 to 7-99 are blocks in the NAND memory 6, in which four blocks form one group, and simultaneous writing can be performed by four channels within a group so that blocks 7-0 to 7-3 are controlled by the channels ch0 to ch3 and blocks 7-4 to 7-7 are controlled by the channels ch0 to ch3.

A diagram to the left of FIG. 6 shows a case where the intermediate state is not saved nor restored. The diagram shows the state of data written to the NAND memory 6 in which one error correction code has been stored in the NAND memory 6, and the next error correction code has not been stored in the NAND memory 6. When the intermediate state is not saved nor restored, after generating an error correction code corresponding to the data of one page of each of the blocks 7-0 to 7-99, data are written to the next page and an error correction coding process is performed. Thus, a state where 100 blocks have a non-written area continues for a long period of time, and the efficiency in the use of blocks is poor.

A diagram to the right of FIG. 6 shows a case where the intermediate state is saved and restored. Similarly to the diagram to the left of FIG. 6, The diagram shows the state of data written to the NAND memory 6 in which one error correction code has been stored in the NAND memory 6, and the next error correction code has not been stored in the NAND memory 6. In this case, as described in FIG. 5, since data are written to all pages of the blocks in each group in the order of groups, only the last four blocks have a non-written area. As above, when the intermediate state is saved and restored, the efficiency in the use of blocks is improved. Although the same effects can be realized by increasing the capacity of the temporary storage buffer 4, when the date length of the coding target data is set to be increased as in the example of FIG. 6, it is not desirable since a very large capacity is required, and the cost increases. For example, in the example of FIG. 6, the temporary storage buffer 4 needs to have a capacity of 100 blocks or more.

Figure 7:
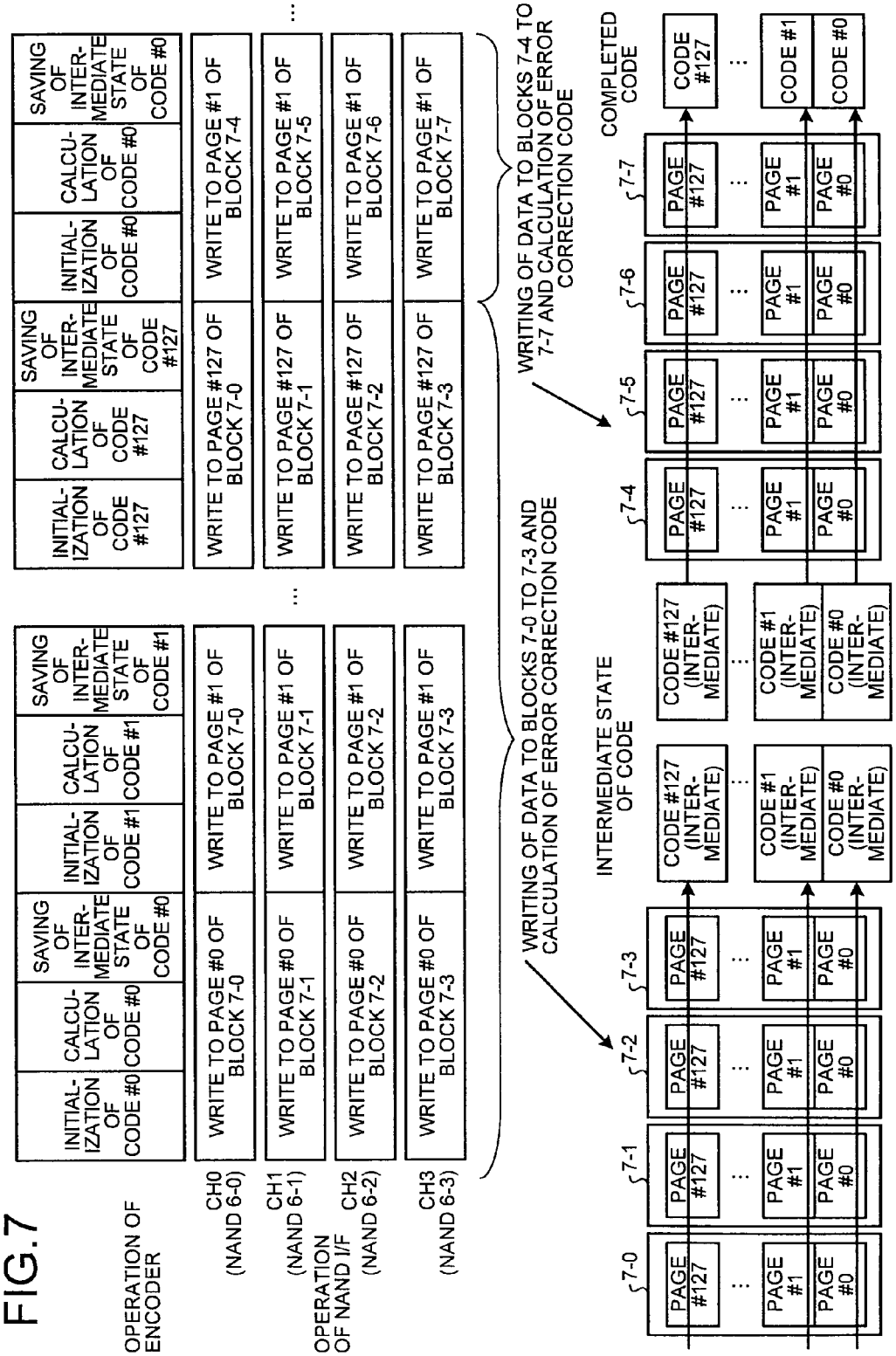
FIG. 7 is a diagram showing an example of the procedure of an error correction coding process and a data writing operation according to the first embodiment.

Next, the procedure of an error correction coding process and a data writing operation according to the present embodiment will be described. FIG. 7 is a diagram showing an example of the procedure of an error correction coding process and a data writing operation according to the present embodiment. In FIG. 7, it is assumed that each block includes 128 pages.

The operations of the encoder 21 are shown on top of FIG. 7. First, the encoder 21 performs an error correction coding process (calculation of code #0) for generating a code #0 based on the data of the page #0 of the blocks 7-0 to 7-3 and saves (stores) the processing result at that time in the ECC area 42 of the temporary storage buffer 4 as the intermediate state of the code #0. Subsequently, the encoder 21 performs an error correction coding process (calculation of code #1) for generating a code #1 based on the data of the page #1 of the blocks 7-0 to 7-3 and saves the processing result at that time in the ECC area 42 of the temporary storage buffer 4 as the intermediate state of the code #1.

After that, in a manner similar to the above, the encoder 21 performs the process in ascending order of pages and saves the intermediate state of a code #127 based on the data of a page #127 of the blocks 7-0 to 7-3. Subsequently, the encoder 21 reads the intermediate state of the code #0 from the ECC area 42 of the temporary storage buffer 4, generates a complete code #0 based on the read intermediate state and the data of the page #0 of the blocks 7-4 to 7-7, and saves the complete code #0 in the ECC area 42 of the temporary storage buffer 4. In a manner similar to the above, the encoder 21 generates a complete error correction code based on the read intermediate state read in ascending order of pages and the data of the blocks 7-4 to 7-7, and saves the complete error correction code in the ECC area 42.

The operations of the NAND I/F 5 are shown per channel on the middle of FIG. 7. The channel ch0 writes the data of the block 7-0 used for the encoder 7-0 to generate the code #0 to the page #0 of the block 7-0 of the NAND memory 6-0. Subsequently, the channel ch0 writes the data of the block 7-0 used for generating the code #1 to the page #1 of the block 7-0 in a manner similar to the above. After that, in a manner similar to the above, the channel ch0 writes data to the block 7-0 in ascending order of pages and performs writing up to the page #127. After writing of data up to the page #127 of the block 7-0 is completed, the channel ch0 writes data to the page #0 of the block 7-4 in a manner similar to the above, and subsequently, performs writing in the ascending order of pages.

The channels ch1 to ch3 perform writing to the blocks 7-1 to 7-3 in the ascending order of pages similarly to the channel ch0 and then perform writing to the blocks 7-5 to 7-7 in the ascending order of pages. The relationship between data stored in each block of the NAND memory 6 and the codes stored in the temporary storage buffer 4 are shown on the lower part of FIG. 7.

The complete error correction code saved in the ECC area 42 of the temporary storage buffer 4 is stored in the NAND memory 6-4 through the NAND I/F 5 in accordance with an instruction of the controller 1. Although there is no limitation in the time when the complete error correction code is written, the error correction code is written, for example, when the writing of the corresponding coding target data to the NAND memory 6 is completed.

In FIG. 7, although the NAND I/F 5 writes data to be processed by the encoder 21 in synchronization with the processing of the encoder 21, the procedure shown in FIG. 7 is an example, and the relationship between the operation timing of the encoder 21 and the operation timing of the NAND I/F 5 is not limited to this. However, when the NAND I/F 5 writes data to be processed by the encoder 21 out of synchronization with the processing of the encoder 21 unlike the case of FIG. 7, the capacity required for the data area 41 of the temporary storage buffer 4 increases more than that required for the case of FIG. 7 where synchronization is achieved.

In the above example, although data of the same page of each block are selected as the coding target data of one complete error correction code, the method of selecting the coding target data is not limited to this. The NAND memory 6 includes areas robust to errors (that is, errors are unlikely to occur in such areas) and areas vulnerable to errors (that is, errors are likely to occur in such areas). For example, in a memory cell capable of storing multiple values, errors are more likely to occur in upper pages than in lower pages. Moreover, in some devices, the robustness to errors is different depending on the position within a block or the position of a block within a chip. In such a case, if error correction codes are generated using only data stored in areas vulnerable to errors as coding target data, there is a possibility that errors are concentrated so that it is not possible to correct the errors. By generating one error correction code by combining data in the areas which are robust and vulnerable to errors, it is possible to improve the possibility to correct errors.

Figure 8:
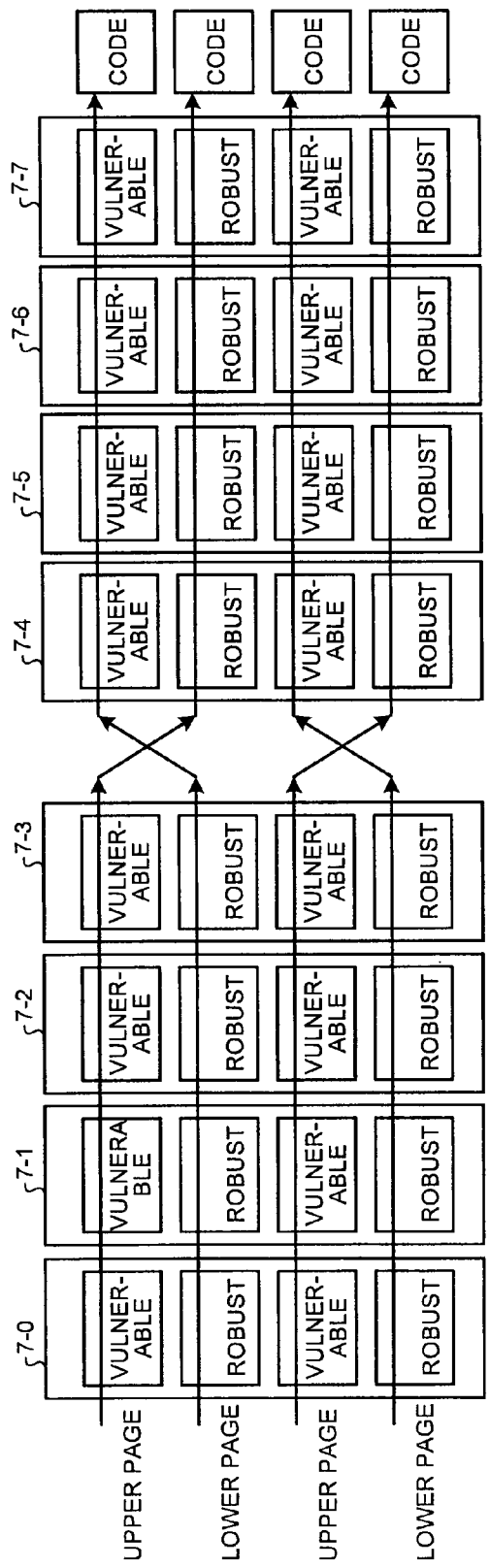
FIG. 8 is a diagram showing an example in which coding target data are formed by combining data of the upper and lower pages.

FIG. 8 is a diagram showing an example in which coding target data are generated by combining data of the upper and lower pages. "Robust" and "Vulnerable" in each block of FIG. 8 indicate the robustness to errors. In such a case, by selecting data of pages having different robustness in the blocks 7-0 to 7-3 and the blocks 7-4 to 7-7 as coding target data, it is possible to improve the possibility to correct errors.

Figure 9:
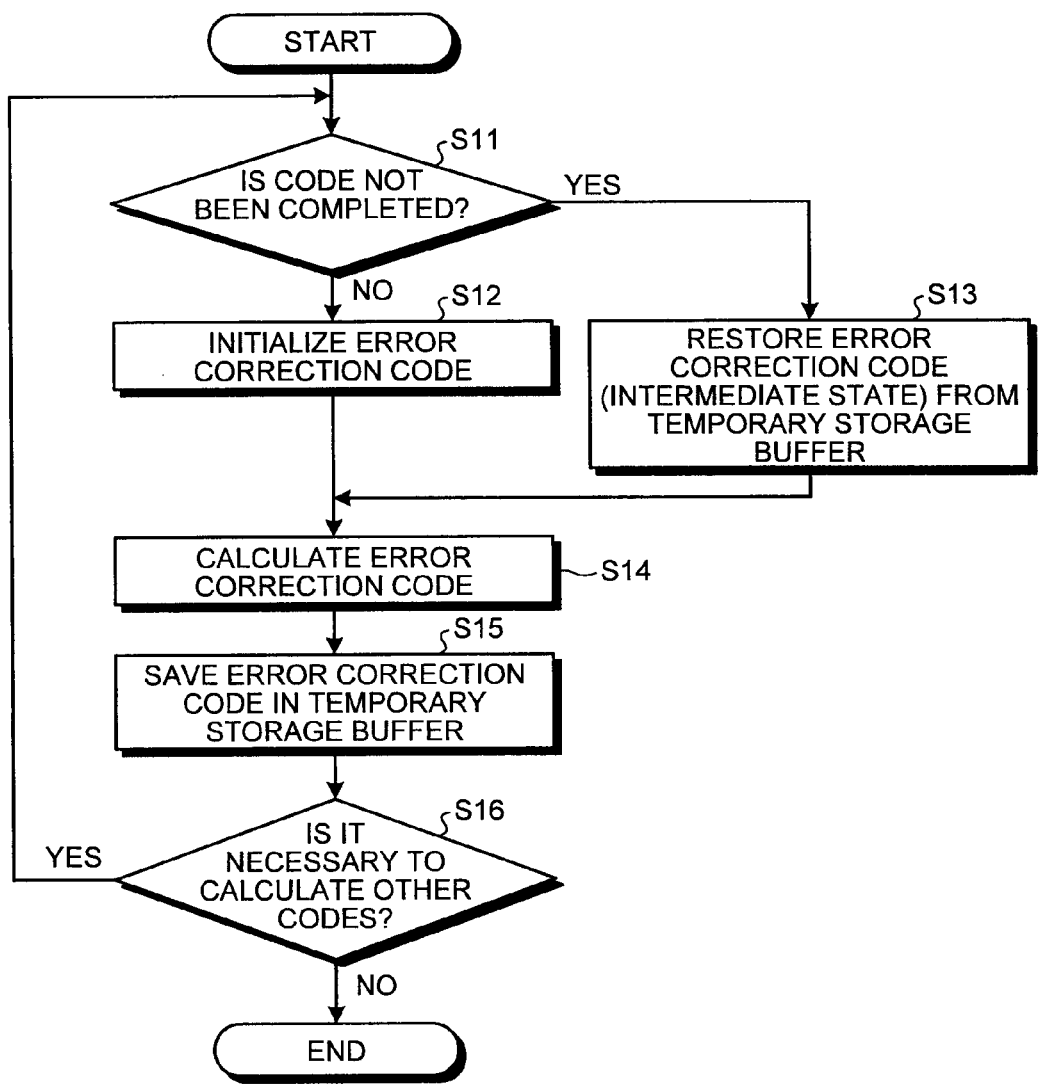
FIG. 9 is a flowchart showing an example of the procedure of an error correction process according to the first embodiment.

Next, an error correction process according to the present embodiment will be described. FIG. 9 is a flowchart showing an example of the procedure of an error correction process according to the present embodiment. As shown in FIG. 9, the coding control unit 12 starts a coding process, for example, when transferring data from the temporary storage buffer 4 to the NAND memory 6, and first determines whether an area of the NAND memory 6 to which coding target data are written is in a state where a code is not finalized (step S11).

It is assumed that the coding control unit 12 is aware of an area (for example, the page #0 of the blocks 7-0 to 7-7 in the case of FIG. 5) on a NAND memory to which coding target data used for generating a complete code are written. Moreover, it is assumed that the coding control unit 12 is aware of the state of an error correction code for each data area on the NAND memory corresponding to one complete error correction code. The state of the error correction code represents whether a coding process is performed, whether the intermediate state of the error correction code has been stored in the temporary storage buffer 4, or whether a complete error correction code has been stored in the temporary storage buffer 4 (that is, a code is finalized). In addition, even when a coding process is not performed (for example, when writing data to the NAND memory 6 for the first time), it will be assumed that a code is finalized.

When it is determined that a code is completed (No in step S11), the coding control unit 12 gives the encoder 21 an instruction on processing target data (which of the data to be written to the NAND memory 6 stored in the data area 41 of the temporary storage buffer 4 will be subjected to the coding process) and instructs the encoder 21 to initialize error correction codes (that is, to set all error correction codes to 0). Then, the encoder 21 initializes the error correction codes based on the instruction (step S12). In this example, data in units of groups as shown in FIG. 5 are instructed as the processing target data. For example, in the example of FIG. 5, data to be written to the page #0 of each of the blocks 7-0 to 7-3 and data to be written to the page #0 of each of the blocks 7-4 to 7-7 are instructed.

When it is determined that the code has not been completed (Yes in step S11), the coding control unit 12 gives the encoder 21 an instruction on processing target data and instructs the encoder 21 to restore (read from the temporary storage buffer 4) the intermediate state of an error correction code corresponding to the data. Then, the encoder 21 restores the intermediate state of the error correction code based on the instruction (step S13).

Subsequently to step S12 or S13, the encoder 21 performs an error correction coding process, and sends a notice of end of processing to the coding control unit 12 when the process ends (step S14). When receiving the notice of end of processing, the coding control unit 12 instructs the encoder 21 to save an error correction code (the intermediate state of the error correction code or a complete error correction code) which is the processing result in the temporary storage buffer 4. Then, the encoder 21 saves the error correction code based on the instruction (step S15).

Subsequently, the coding control unit 12 determines whether there is additional coding target data (step S16), and the process ends when there is no additional coding target data (No in step S16). When there is additional coding target data (Yes in step S16), the flow returns to step S11.

Figure 10:
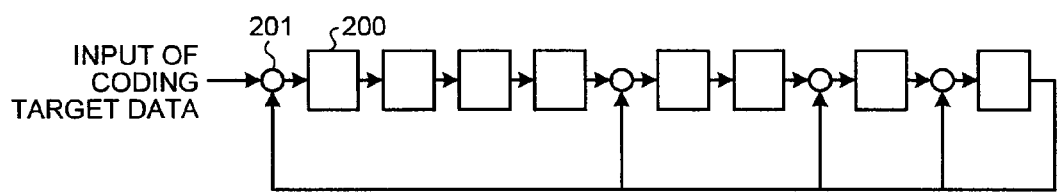
FIG. 10 is a diagram showing a configuration example of a coding circuit.

FIG. 10 is a diagram showing a configuration example of a coding circuit which constitutes the encoder 21. FIG. 10 shows an example of a coding circuit when a BCH code is used as an error correction code, and an equation shown in Equation (1) below is used as a generator polynomial F(x).

$$F(X)=X^8+X^7+X^6+X^4 1 \tag{1}$$

In the example of FIG. 10, the coding circuit includes eight shift registers 200 and four XOR (exclusive OR) circuits 201. When initializing error correction codes, all shift registers 200 are set to 0. In the coding circuit, data of each page of each block are sequentially input as coding target data, and the values of the respective shift registers 200 in a step in which all data of one group are input are saved as the intermediate state of the error correction code. For example, in the example of FIG. 5, data of the page #0 of the block 7-0, the data of the page #0 of the block 7-1, the data of the page #0 of the block 7-2, and the data of the page #0 of the block 7-3 are input in that order, and after that, the values of the respective shift registers 200 are saved in the temporary storage buffer 4 as the intermediate state of the error correction code.

When the intermediate state is restored and processing is performed, the intermediate state of the error correction code read from the temporary storage buffer 4 is set to the respective shift registers 200. After that, processing target data are sequentially input. For example, in the example of FIG. 5, after the intermediate state of the error correction code is set to the respective shift registers 200, the data of the page #0 of the block 7-4, the data of the page #0 of the block 7-5, the data of the page #0 of the block 7-6, and the data of the page #0 of the block 7-7 are input in that order, and after that, the values of the respective shift registers 200 are saved in the temporary storage buffer 4 as a complete error correction code.

The configuration of the coding circuit shown in FIG. 10 is an example, and the configuration of the coding circuit is not limited to this, and an optional circuit configuration may be used depending on an error correction coding method being used.

Next, the operation of the semiconductor storage device 100 when a power-off instruction (for example, a flash command) is received from the host device will be described. When powering off by itself or releasing the connection with the semiconductor storage device 100, for example, the host device issues a flash command, an idle command, a sleep command, or the like to the semiconductor storage device 100 to thereby instruct the semiconductor storage device 100 to terminate processing so as to finalize a state (for example, to write data which have been received from the host device but have not been written to the NAND memory 6). In the following description, although a case where a flash command is issued has been described, the same can be applied to when an idle command, a sleep command, or the like is issued.

When the code length is increased (the number of coding target data of a complete error correction code is increased), it takes time until the complete error correction code is stored in the NAND memory 6. Thus, when a state is finalize in response to a flash command, there is a possibility that data of which the complete error correction code has not been stored (data which are not protected by an error correction code) may occur. On the other hand, although the intermediate state of an error correction code is stored in the temporary storage buffer 4, the data stored in the temporary storage buffer 4 will be lost by the power-off. Thus, in order to prevent the occurrence of data which are not protected by the error correction code, in the present embodiment, the intermediate state of the error correction code is stored in the NAND memory 6 when a flash command is received.

The semiconductor storage device 100 halts the procedure of normal processing and proceeds to processing during flashing upon receiving the flash command. In the processing during flashing, although writing data which have been stored in the temporary storage buffer 4 but have not be written to the NAND memory 6 are written to the NAND memory 6, in the present embodiment, the intermediate state of the error correction code is also stored in the NAND memory 6.

Figure 11:
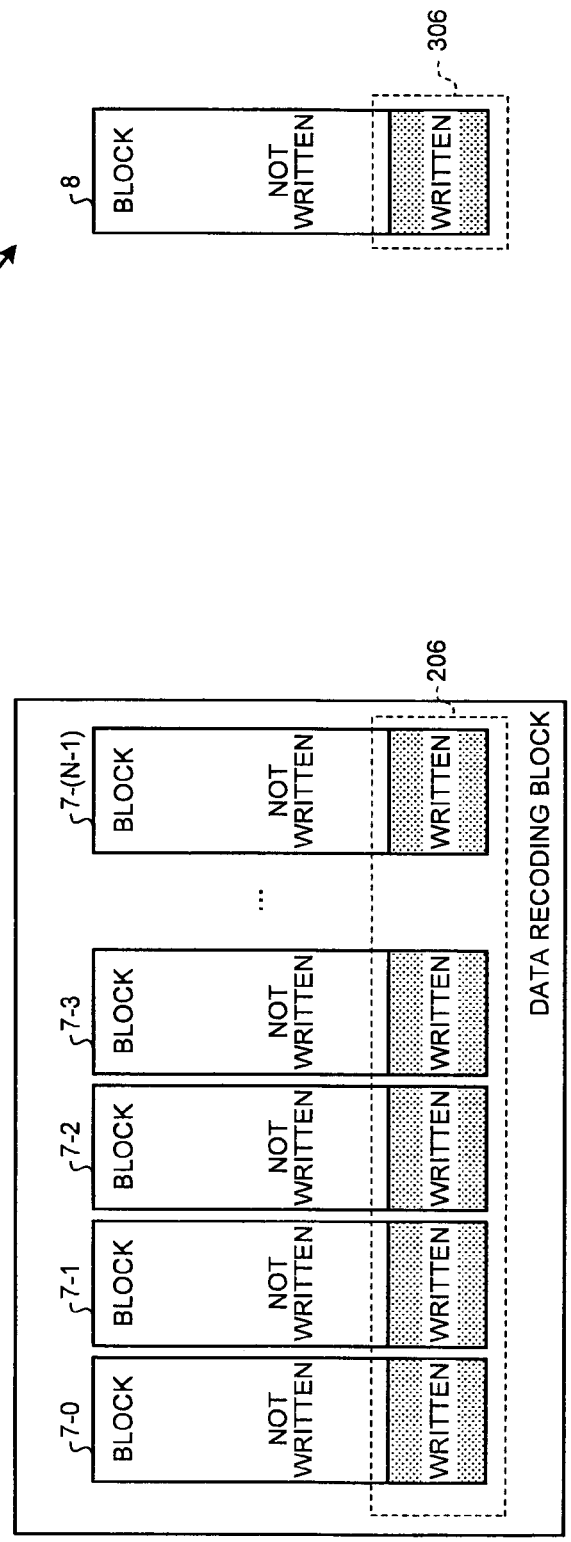
FIG. 11 is a diagram showing an example of a correspondence table.

FIG. 11 is a diagram illustrating an example of a correspondence table showing the correspondence of the storage positions, on the NAND memory 6, of the error correction code and the coding target data. As shown in FIG. 11, the correspondence between the position of the coding target data and the position of the corresponding error correction code is stored in the correspondence table. For example, the correspondence between the position, on the NAND memory 6, of the coding target data 206 written to a certain page (for example, the page #0) of blocks 7-0 to 7-(N-1) (N=the number of blocks that constitute coding target data) and the position, on the NAND memory 6, of a complete error correction code 306 generated based on the coding target data 206 is stored.

Although the controller 1 also manages the correspondence relation between the logical address (LBA) designated from the host device and the storage position on the NAND memory, the correspondence between the logical address (LBA) and the storage position on the NAND memory 6 may be managed separately from the correspondence table described above, and they may be managed integrally as one correspondence table. In the case of they are integrated, the logical address, the position of the written coding target data 206 on the NAND memory 6, and the position, on the NAND memory 6, of the complete error correction code 306 generated based on the coding target data 206 are managed as a correspondence table.

This correspondence table is held by the code management unit 11 of the controller 1. The code management unit 11 controls writing of data to the NAND memory 6 and updates the correspondence table based on the position of data written to the NAND memory 6. In a normal case, the correspondence between the coding target data and the complete error correction code is written to the correspondence table in this way.

Figure 12:
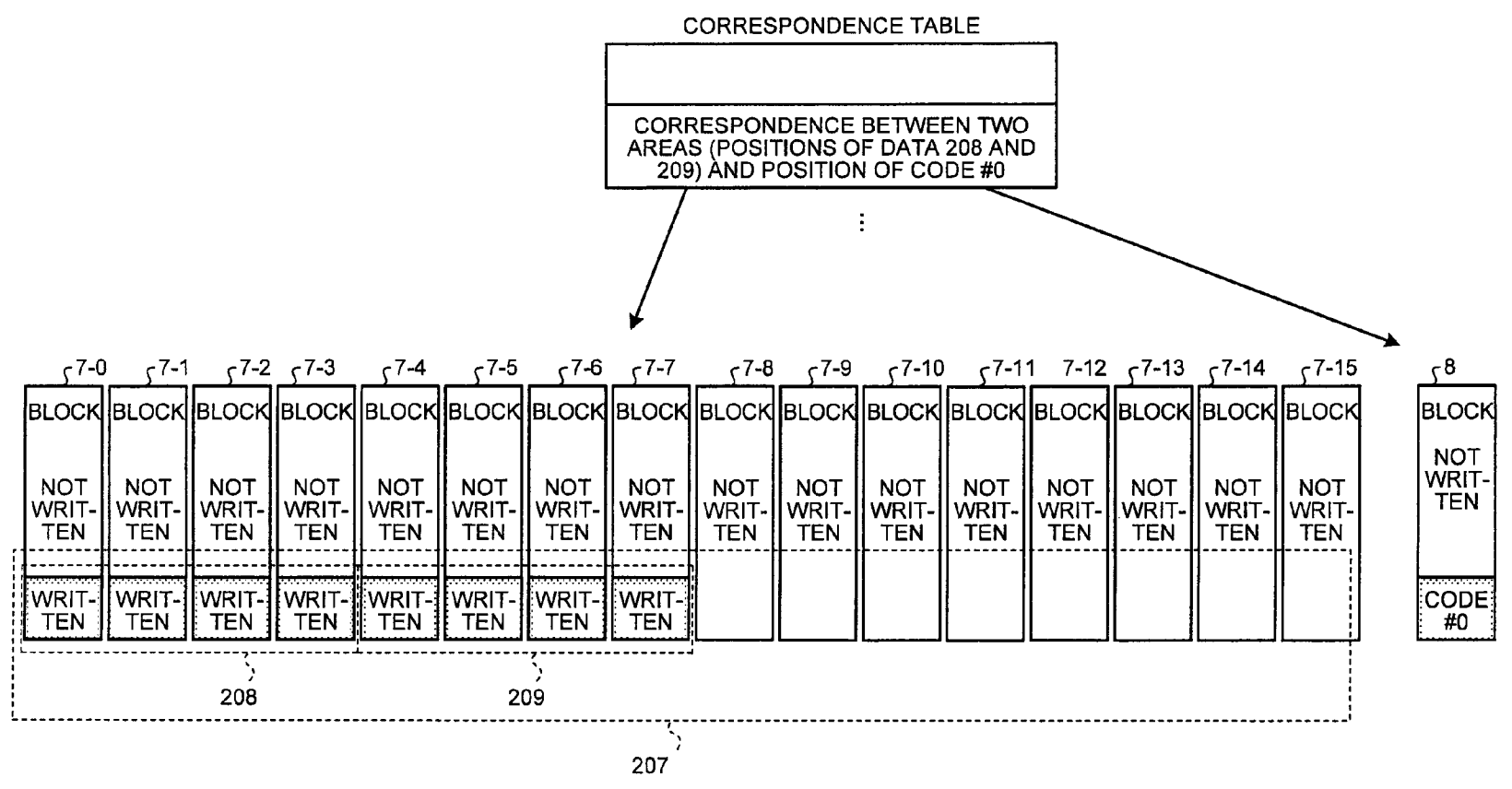

FIG. 12 is a diagram illustrating an example of a code writing operation during flashing. In FIG. 12, it is assumed that one complete error correction code is generated based on coding target data 207 of 16 blocks. In this case, it is assumed that a process in which a first intermediate state is saved in the temporary storage buffer 4 by an error correction coding process on blocks 7-0 to 7-3, a second intermediate state is saved by an error correction coding process on blocks 7-4 to 7-7, a third intermediate state is saved by an error correction coding process on blocks 7-8 to 7-11, and a complete error correction code is saved by an error correction coding process on blocks 7-12 to 7-15 is performed for each page.

In this case, it is assumed that the controller 1 receives a flash command during a period after an intermediate state is saved in the temporary storage buffer 4 by an error correction coding process on data 208 to be written to the blocks 7-0 to 7-3 of the page #0, for example, and before the second intermediate state is saved by an error correction coding process on data 209 to be written to the blocks 7-4 to 7-7 of the page #0. In this case, the code management unit 11 stores a code #0 which is the intermediate state of the error correction code of the data 208 in the block 8 (code block) of the NAND memory 6-4. In this example, although it is assumed that the data 208 of the NAND memory 6 have been written to the NAND memory 6 before receiving a flash command, if the data 208 have not been written, the data 208 are also written to the NAND memory 6. The code management unit 11 stores the position, on the NAND memory, of the code #0 and the position, on the NAND memory 6, of the processing target data (the data 208) of the code #0 are stored in the correspondence table in a correlated manner.

Figure 13:
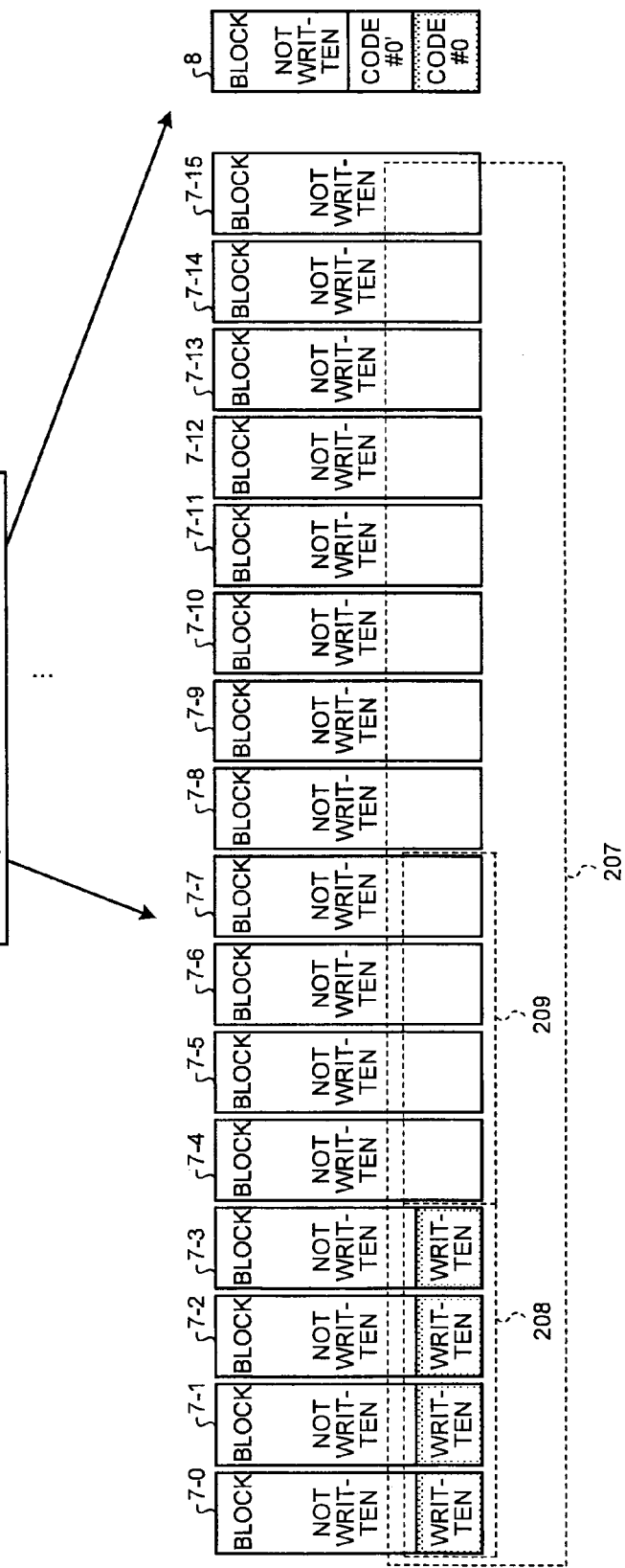
FIG. 13 is a diagram showing another example of a code writing operation during flashing.

FIG. 13 is a diagram illustrating another example of a code writing operation during flashing. In FIG. 13, it is assumed that a subsequent flash command is received after the code #0 has been written to the NAND memory 6 by the flash command through the operation described in FIG. 12, and furthermore, the data 209 have been stored in the temporary storage buffer 4. In this case, a code #0' which is the intermediate state generated based on the data 209 is stored in the block 8 of the NAND memory 6-4. The correspondence between the position of the data 208 and 209 and the position of the code #0' is stored in the correspondence table, and the information on the code #0 which has been stored in the correspondence table is invalidated. The invalidation method is an arbitrary method. For example, when information on a corresponding new code (for example, information on the code #0') is written to the correspondence table, it may be automatically determined that old information (for example, information on the code #0) is invalid. A flag indicating whether a code is valid or invalid may be stored for each code so that validity of the code is explicitly managed by the flag.

Figure 14:
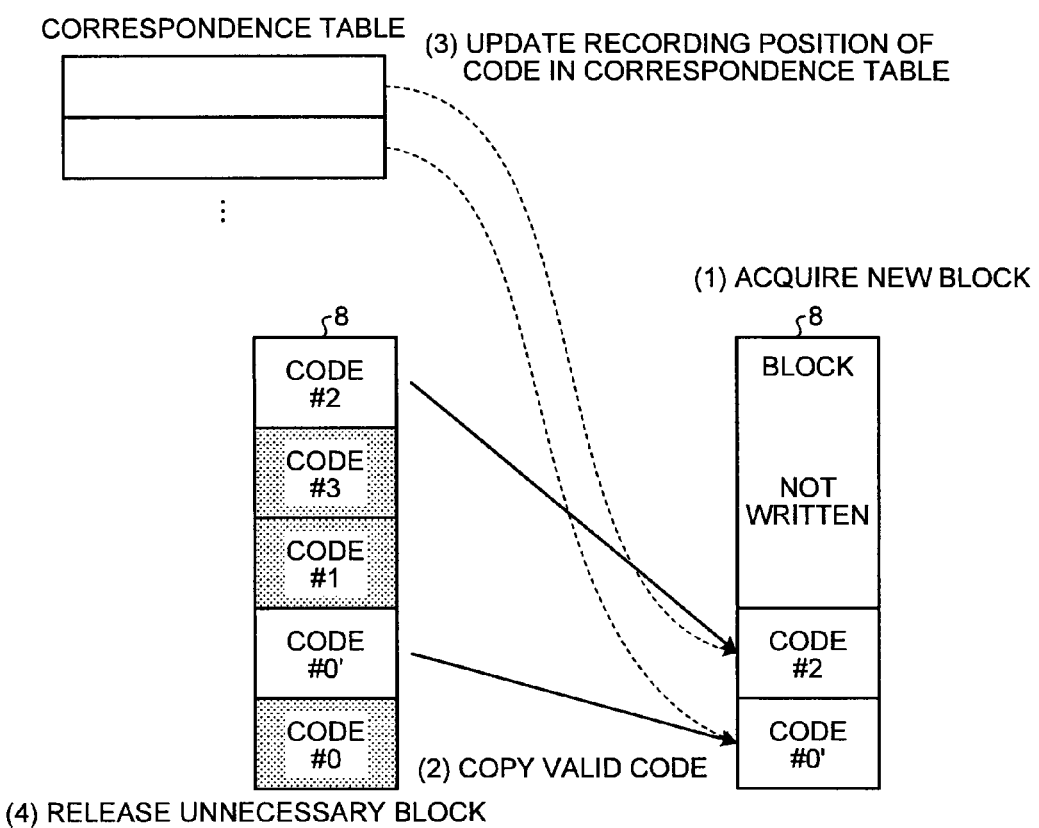
FIG. 14 is a diagram showing an example of code compaction.

As described with reference to FIG. 13, when an invalidated code is stored in the NAND memory 6, since the area on the NAND memory 6 is wasted, code compaction may be performed. FIG. 14 is a diagram illustrating an example of code compaction. In FIG. 14, hatched codes represent invalidated codes. In such a case, code compaction is performed in the following procedure.

(1) First, an area of a new block for storing valid codes #2 and #0' is acquired.

(2) Subsequently, the valid codes #2 and #0' are copied to the acquired area of the new block.

(3) The positions of codes in the correspondence table, of the valid codes #2 and #0' are updated.

(4) The block which becomes unnecessary is released.

In FIGS. 12 and 13, although the intermediate state of the error correction code is written to the code block when a flash command is received, the intermediate state of the error correction code may be written to a data block.

Figure 15:
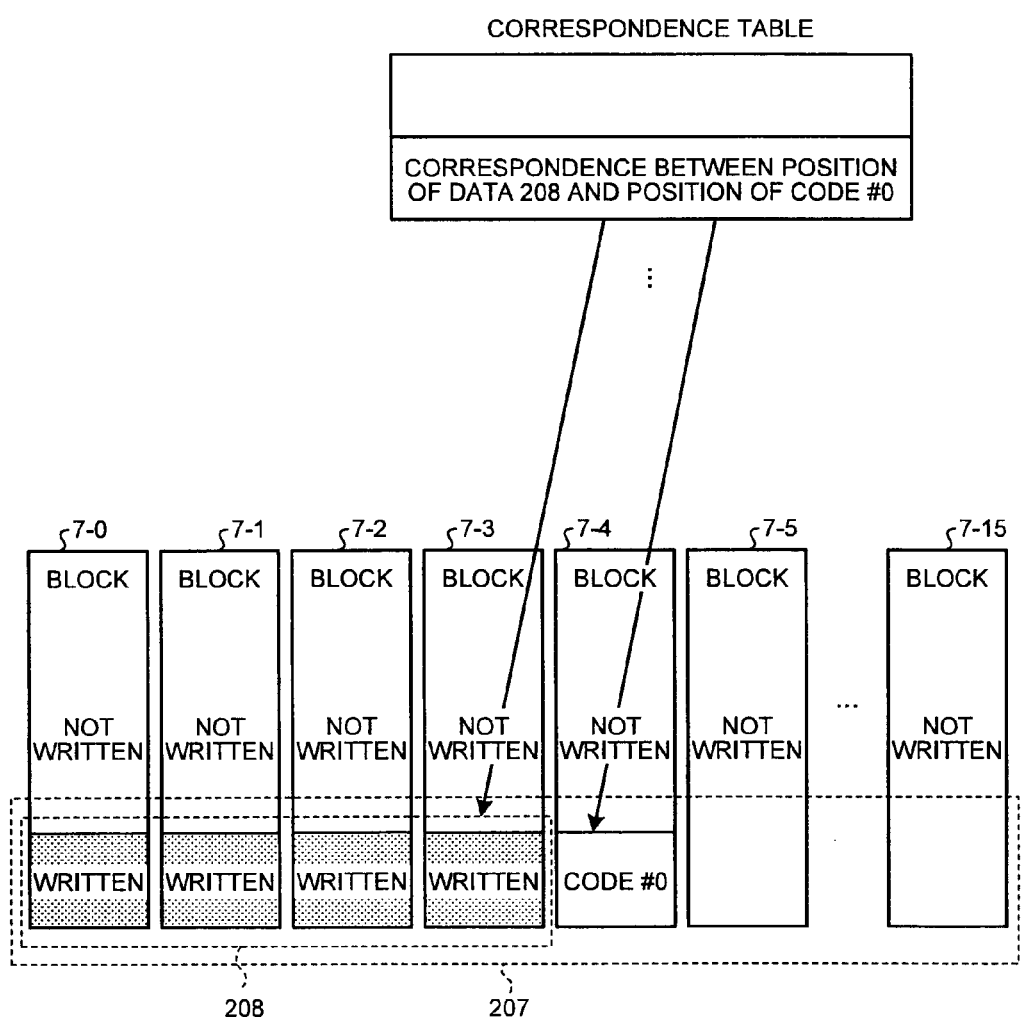
FIG. 15 is a diagram showing an example of a writing method when writing an intermediate state of an error correction code into a data block.
Figure 16:
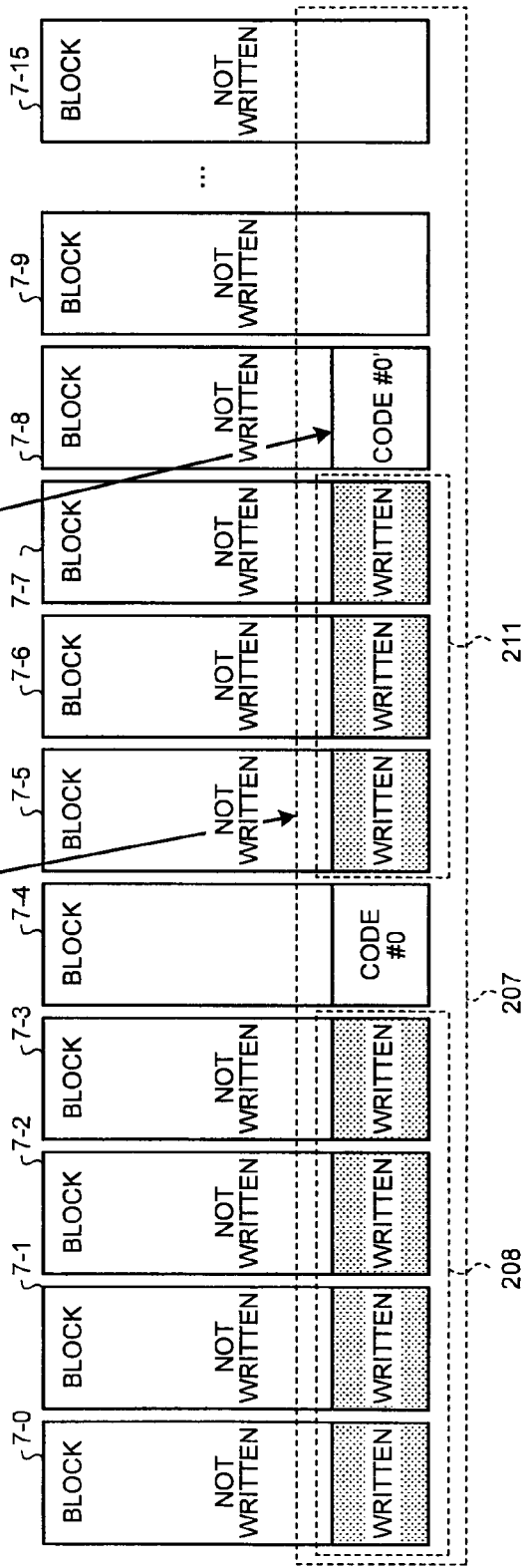
FIG. 16 is a diagram showing an example of a writing method when writing an intermediate state of an error correction code into a data block.

FIGS. 15 and 16 are diagrams illustrating an example of a writing method when writing an intermediate state of an error correction code into a data block. In the example of FIG. 15, a code #0 which is the intermediate state of an error correction code corresponding to coding target data 208 is stored in a block 7-4. In this case, the position of the coding target data 208 and the position of the code #0 are also stored in the correspondence table in a correlated manner.

In the example of FIG. 16, from the state shown in FIG. 15, data 211 is further written, and a code #0' which is the intermediate state of an error correction code corresponding to the data 208 and 211 is written to a block 7-8. When writing data after the code #0 is written, data are stored in only three blocks of blocks 7-5 to 7-7. In this case, the fact that the code #0' has been generated based on the data 208 of the blocks 7-0 to 7-3 and the data 211 of the blocks 7-5 to 7-7 is stored in the correspondence table.

When the code #0 is written to a data area, the code #0' may be calculated using a method of calculating the code #0' by treating the code #0 as data. By doing so, a correction process (decoding process) can be performed without discriminating the intermediate state of a code from data.

Figure 17:
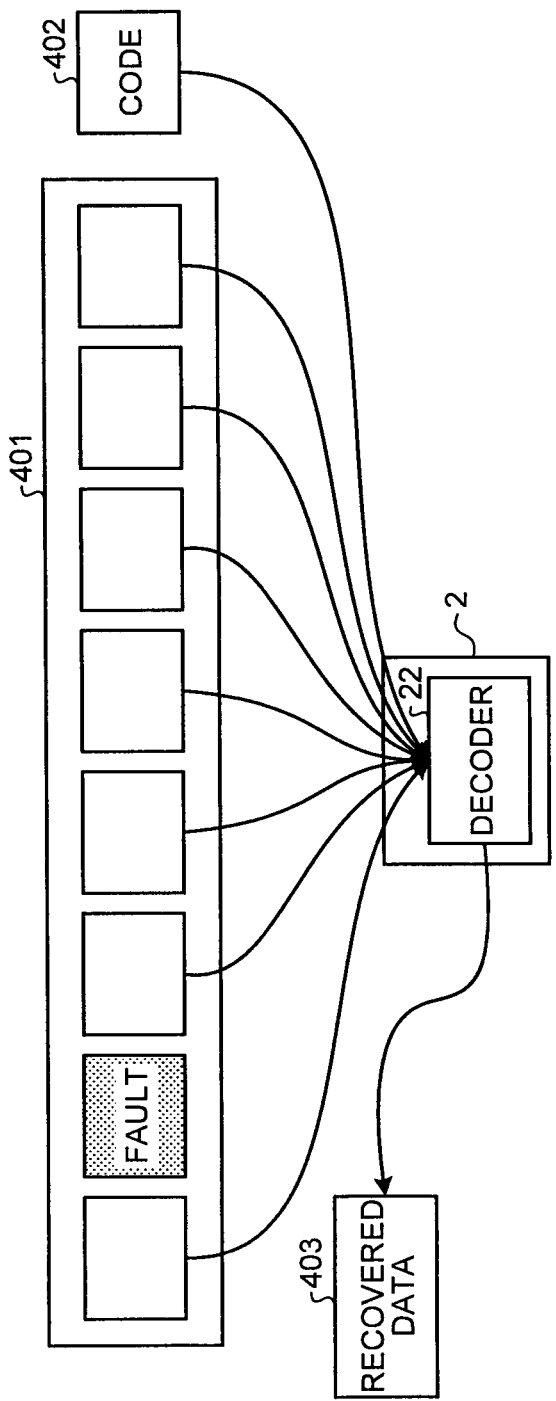
FIG. 17 is a diagram showing the concept of a decoding process according to the first embodiment.

Next, a decoding process according to the present embodiment will be described. FIGS. 17 to 20 are diagrams illustrating the concept of the decoding process according to the present embodiment. In this example, it is assumed that one complete error correction code is generated using eight blocks similarly to the example shown in FIG. 5. FIG. 17 illustrates a decoding process according to the present embodiment when a complete error correction code is stored in the NAND memory 6. FIG. 17 shows an example in which one page of eight pages is corrected using a parity calculated by the exclusive OR operation. It is assumed that a code 402 is generated based on data 401 of eight blocks, and a failure occurs in a block in which the data 401 are stored. In this case, the decoder 22 of the ECC encoder/decoder 2 can perform a decoding process based on data of blocks other than the fault block among the data 401 read from the NAND memory 6 and the code 402 (complete error correction code) corresponding to the data 401 read from the NAND memory 6 to thereby restore the data of the fault block and obtain restored data 403.

Although FIG. 17 shows a case of using a parity calculated by the exclusive OR operation, when a BCH code, a RS code, or the like is used, all data (including data of the fault block) and error correction codes are read and input to the decoder 22. The process corresponding to each code is the same as that of the related art, and a process corresponding to an error correction code being used is performed. It is assumed that a CRC (Cyclic Redundancy Check) code is appended to data so that a fault area can be detected. Appending of the CRC code is the same as that of the related art. A decoding process using the complete error correction code (but not using the intermediate state) is the same as that of the related art, and detailed description thereof will not be provided.

Figure 18:
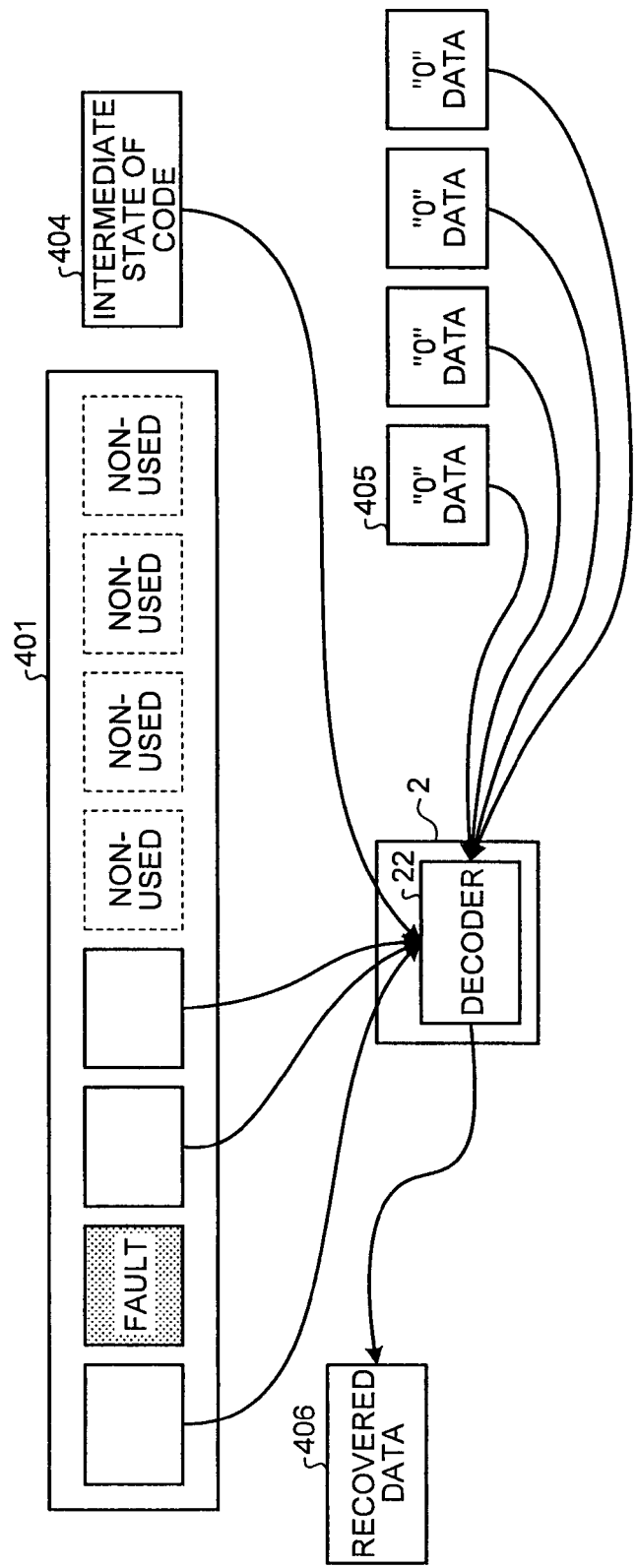
FIG. 18 is a diagram showing the concept of a decoding process according to the first embodiment.

FIG. 18 shows an example of performing a decoding process using the intermediate state of an error correction code. FIG. 18 shows an example in which the intermediate state of an error correction code is stored in a block different from a block in which data are stored. The decoder 22 performs a decoding process using data of a block other than a fault block among the data 401 of eight blocks and the intermediate state 404 of the error correction code. It is assumed that the intermediate state 404 of the error correction code is the intermediate state corresponding to the first four blocks, and the remaining four blocks are in a non-used state (that is, data are not written to the blocks). In this case, the decoding process is performed using four "0" data 405 instead of the data of the four non-used blocks. In this way, it is possible to restore data of the fault block and to obtain restored data 404.

Figure 19:
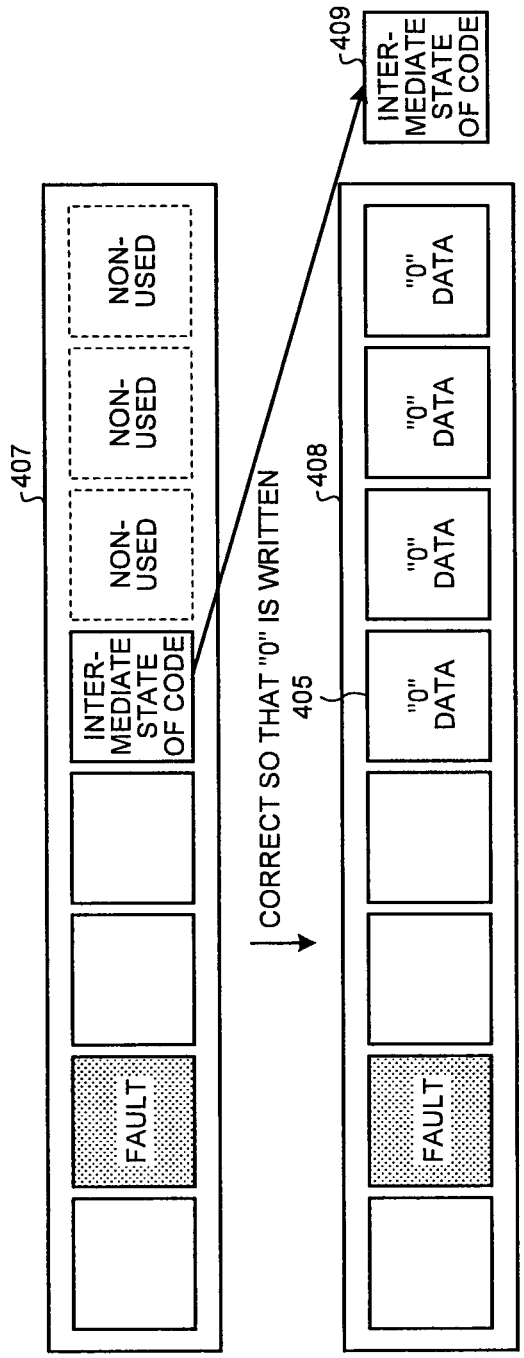
FIG. 19 is a diagram showing the concept of a decoding process according to the first embodiment.

FIG. 19 shows an example in which the intermediate state of an error correction code is stored in a block in which data will be stored. In this case, the same "0" data 405 as FIG. 18 are used instead of the data of the non-used block, and furthermore, the "0" data 405 are used as the data of a block in which the intermediate state of a code is stored. The decoder 22 performs a decoding process using the intermediate state 409 of the error correction code while using the data of the four blocks in which data are written and the four "0" data as input data 408. Although FIGS. 18 and 19 show a case of using a parity, when other codes such as a BCH code or a RS code are used, the decoding process is performed in accordance with the properties of codes. Even in this case, similarly to the above, the "0" data may be used instead of the data of non-used blocks and the data of blocks in which the intermediate state of a code is stored.

Figure 20:
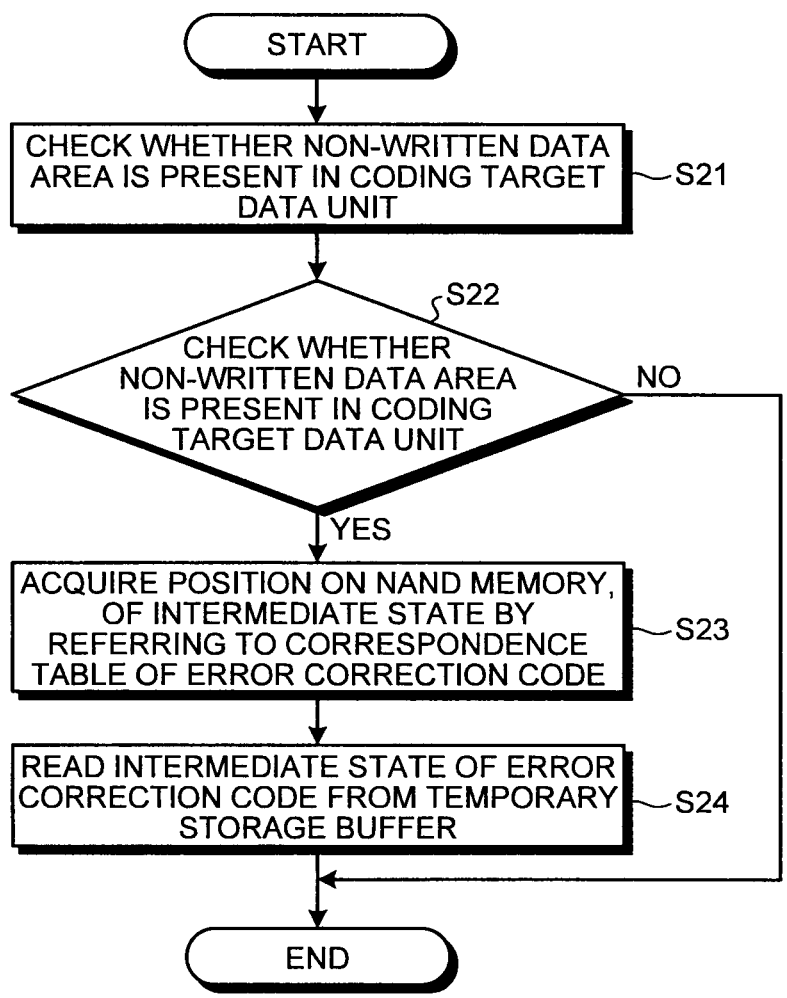
FIG. 20 is a diagram showing the concept of a decoding process according to the first embodiment.

FIG. 20 is a flowchart illustrating an example of a processing procedure during starting when the intermediate state of an error correction code is stored in the NAND memory 6. As described above, after the intermediate state of an error correction code is stored in the NAND memory 6 in accordance with a flash command, when the semiconductor storage device 100 restarts, writing (writing of the data 209 in FIG.

12) starts from a non-written area in which a complete error correction code has not been calculated. When writing starts from such a non-written area, the intermediate state of an error correction code stored in the NAND memory 6 is read, and an error correction coding process is performed.

Thus, during the start-up, the code management unit 11 of the semiconductor storage device 100 first checks whether there is a non-written data area within an coding target data unit (step S21) to thereby determine whether there is a non-written data area (step S22).

When there is a non-written data area (Yes in step S22), the code management unit 11 acquires the position, on the NAND memory 6, of the intermediate state of an error correction code corresponding to the non-written data area by referring to the correspondence table (step S23) and reads the intermediate state of the error correction code from the acquired position to store the intermediate state in the temporary storage buffer 4 (step S24), and the process ends. When there is not a non-written data area (No in step S22), the process ends. After performing the process shown in FIG. 20, the above-described coding process shown in FIG. 9 is performed.

Next, a redundancy process to deal with abnormal power-off will be described. There is a case where the semiconductor storage device 100 is powered off without receiving a flash command (this is an abnormal power-off). When an abnormal power-off occurs, the above-described operation when a flash command is received cannot be performed, and the power is turned off in the course of processing. In order to protect data written to the NAND memory 6 against the abnormal power-off, in the present embodiment, a redundancy process as below is performed.

Figure 21:
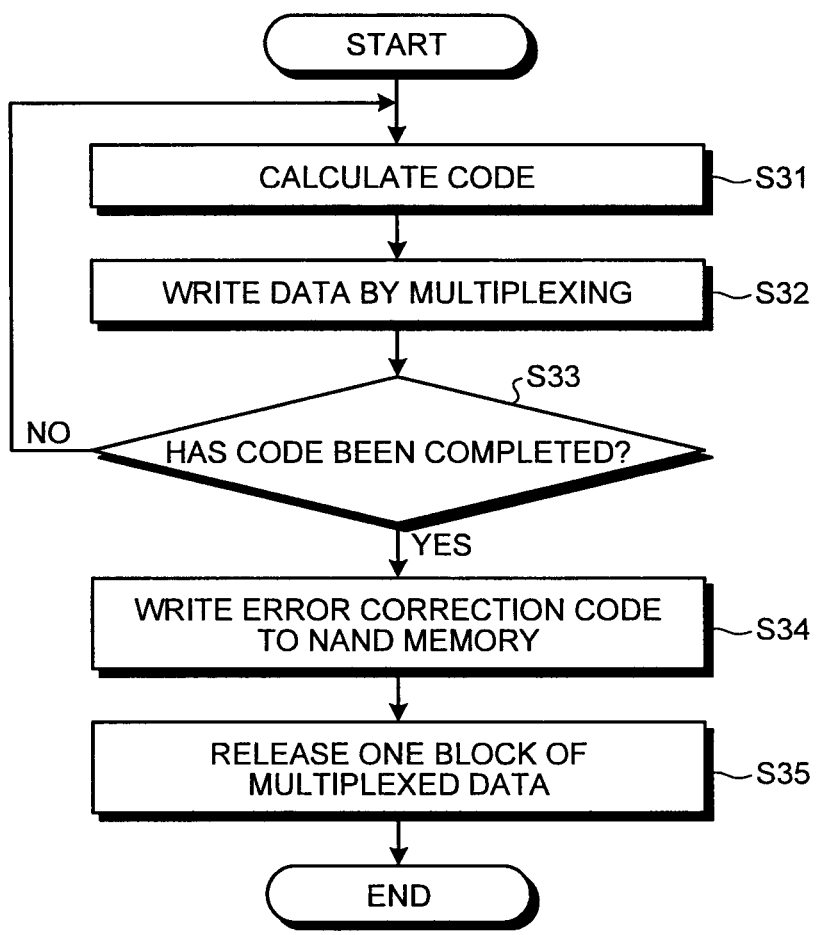
FIG. 21 is a flowchart showing an example of the procedure of a redundancy process.

FIG. 21 is a flowchart illustrating an example of the procedure of a redundancy process in the semiconductor storage device 100. First, when data to be written to the NAND memory 6 are transferred from the host device, the controller 1 starts the error correction coding process (calculation of codes) in accordance with the procedure shown in FIG. 9 (step S31), and writes the writing data to the NAND memory 6 by multiplexing (step S32). The multiplexing means writing the same writing data to a plurality of areas of the NAND memory 6. Although in this example, the data are written to two areas, the data may be written to three or more areas. Although there is no limitation in the positions to which the same writing data are written by multiplexing, it is preferable that the same writing data be stored at positions where a failure occurs at the same time.

Subsequently, the controller 1 determines whether an error correction code has been completed (whether a complete error correction code has been generated) (step S33). When the error correction code has been completed (Yes in step S33), the controller 1 writes the error correction code to the NAND memory 6 (step S34). The controller 1 releases the other block of data multiplexed with respect to the data of which the error correction code is stored in the NAND memory 6 (step S35), and the process ends.

When the error correction code has not been completed (No in step S33), the flow returns to step S31. As above, in the present embodiment, data are first made redundant by multiplexing, and when an error correction code is completed and is written to the NAND memory 6, data are made redundant by the error correction code. The data protected by the multiplexing and the error correction code is not limited to the writing data transferred from the host device, but management information used by the semiconductor storage device 100 may be subjected to the same redundancy process. Examples of a method of making the management information in a similar manner include a method of multiplexing similarly to the case of data, and a method of writing the management information to the NAND memory 6 and writing only the updated information of the management information to the NAND memory 6 to thereby recording the same information in a multiplexed manner.

In the present embodiment, although a group which is the unit of generating the intermediate state of an error correction code is configured to include each block selected from different chips, the configuration of the group is not limited to this. Moreover, as described above, the blocks may not be grouped. Moreover, there is no limitation in the correction capability of the error correction code and the method of selecting the coding target data. For example, coding target data may be selected over from chips so as to be capable of dealing with chip failures. Data may be selected from an optional page within a block in this way so as to be capable of dealing with a page failure which is a failure occurring in a smaller range of areas than a block failure. Moreover, there is no limitation in the types of error correction codes being used.

In the above description, the relation between the total number of blocks per chip and the number of blocks for generating a complete error correction code is not specified. For example, when the total number of blocks per chip is 16, and a complete error correction code is generated using data of eight blocks, the blocks of each chip may be divided into processing units made up of eight blocks. When writing of data to all blocks of one processing unit and writing of the complete error correction code have been completed, writing of data to blocks of the next processing unit may be performed.

As described above, in the present embodiment, the intermediate state of an error correction code on which an error correction coding process has been performed using part of coding target data corresponding to the error correction code as an input is stored in the temporary storage buffer 4, an error correction process on the subsequent data within the coding target data of the same error correction code is performed using the intermediate state of the error correction code stored in the temporary storage buffer 4 as an initial value. Thus, even when the amount of correction target data of one error correction code is increased, a decrease in the efficiency in the use of blocks of the NAND memory 6 can be prevented.

Second Embodiment

Figure 22:
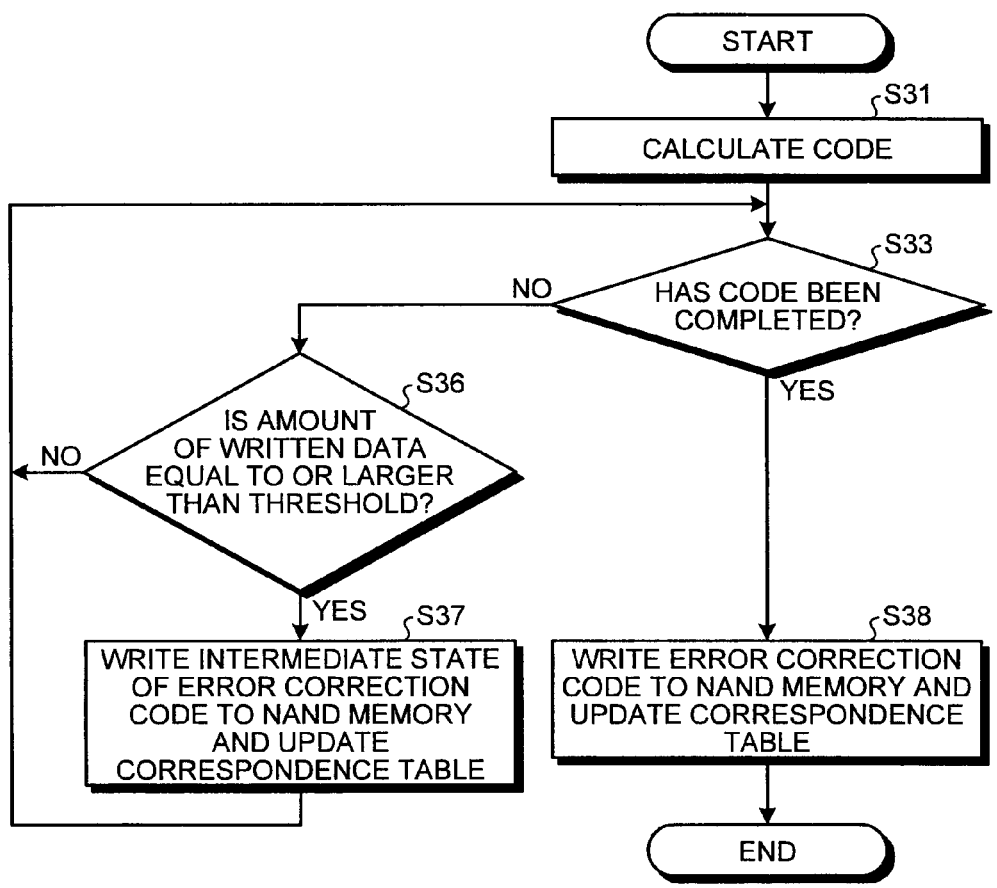
FIG. 22 is a flowchart showing an example of the procedure of a redundancy process according to a second embodiment.

FIG. 22 is a flowchart illustrating an example of the procedure of a redundancy process in the semiconductor storage device 100 according to the second embodiment. The semiconductor storage device 100 of the present embodiment has the same configuration as the semiconductor storage device 100 of the first embodiment. Constituent elements having the same functions as the first embodiment will be denoted by the same reference numerals, and redundant description thereof will not be provided.

In the first embodiment, data are made redundant by multiplexing until the error correction code is completed, and after the error correction code is completed and written to the NAND memory 6, data are made redundant by the error correction code so that data are protected against an abnormal power-off.

In the present embodiment, data multiplexing is not performed, but the intermediate state of an error correction code is periodically stored in the NAND memory 6 to thereby protect data against an abnormal power-off. As shown in FIG. 22, first, the controller 1 starts the error correction coding process (calculation of codes) in a manner similarly to the first embodiment (step S31), and determines whether an error correction code has been completed (step S33).

When the error correction code has not been completed (No in step S33), the controller 1 determines whether the amount of data written to the NAND memory 6 (the amount of data of which the corresponding error correction code is not stored in the NAND memory 6) is equal to or larger than a predetermined threshold (step S36). When the amount of written data is equal to or larger than a predetermined threshold (Yes in step S36), the controller 1 writes the intermediate state of the error correction code to the NAND memory 6 and updates the correspondence table (step S37), and the flow returns to step S33. A method of writing the intermediate state to the NAND memory 6 in step S37 is the same as the writing method when a flash command is received. It is assumed that information or the like capable of specifying data that can be protected by the intermediate state is recorded in the correspondence table for each of the intermediate states written to the NAND memory 6.

On the other hand, when it is determined in step S33 that the error correction code has been completed (Yes in step S33), the controller 1 writes the completed error correction code to the NAND memory 6 and updates the correspondence table (step S38), and the process ends. When the amount of written data is smaller than the threshold (No in step S36), the flow returns to step S33.

When performing the operation of step S36 after the operation of step S37 is performed, the amount of written data excluding data of which the intermediate state of the error correction code written to the NAND memory 6 is stored as writing data is compared with the threshold.

Although the threshold used in the determination of step S36 may be an optional value, when the threshold is set to be small, the amount of writing codes (intermediate states) increases. When the threshold is set to be large, the amount of codes decreases, and the amount of data that are not protected increases. Thus, it may be desirable to appropriately set the threshold by tradeoff taking these factors into consideration.

For example, when a complete error correction code is generated based on the data of 16 blocks, and three intermediate states (per complete error correction code) in total are stored in the temporary storage buffer 4 every four blocks, the threshold may be set so that all three intermediate states are stored in the NAND memory 6, and the threshold may be set so that only one intermediate state is stored.

Figure 23:
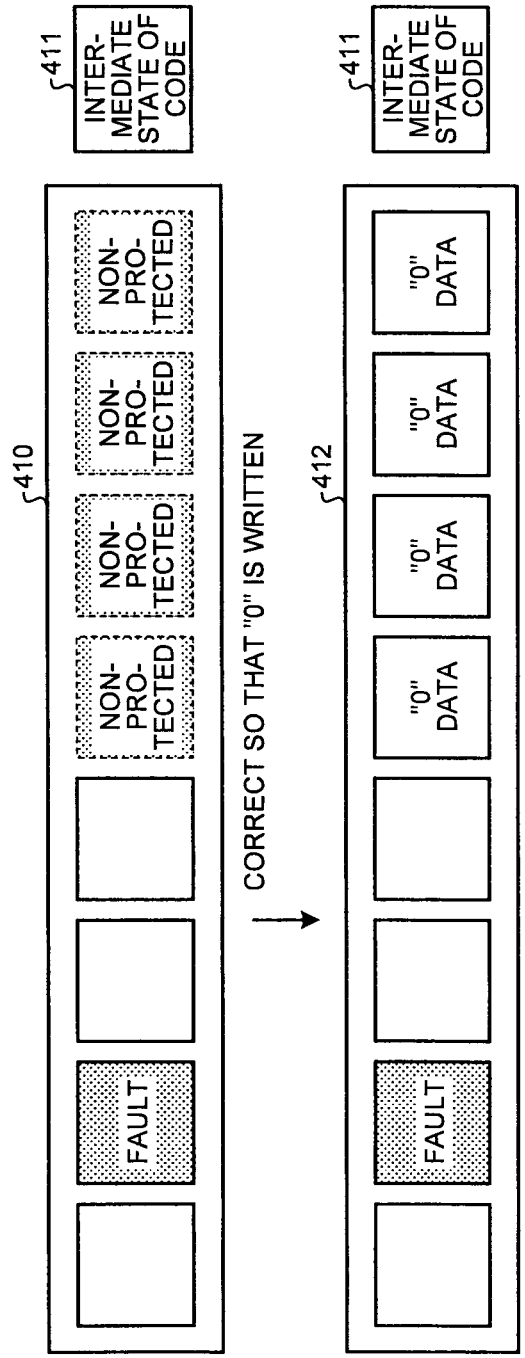
FIG. 23 is a diagram showing the concept of a decoding process after an abnormal power-off according to the second embodiment.

FIG. 23 is a diagram illustrating the concept of a decoding process according to the present embodiment after an abnormal power-off occurs. FIG. 23 shows an example in which when a complete error correction code is generated based on the data 410 of 8 blocks, an abnormal power-off occurs in a period after the intermediate state 411 of a code (error correction code) using the first four blocks is written to the NAND memory 6, and before the complete error correction code is written to the NAND memory 6. Data denoted by "unprotected" are data which are not protected by an error correction code since the intermediate state or a complete code is not recorded in the NAND memory 6 although data are recorded in the NAND memory 6. In such a case, the decoding process is performed using the "0" data instead of the unprotected data. In addition, the same process is performed even when part of the portions denoted by "unprotected" is a non-written area in which information has not been written. The operation of the present embodiment other than the operations described above is the same as the first embodiment.

As above, in the present embodiment, data multiplexing is not performed, and even when a flash command is not received, the intermediate state of the error correction code is periodically stored in the NAND memory 6, for example, to thereby make data redundant. Thus, since it is not necessary to use the NAND memory 6 for the multiplexing, the NAND memory 6 can be used more efficiently than the first embodiment.

Third Embodiment

Figure 24:
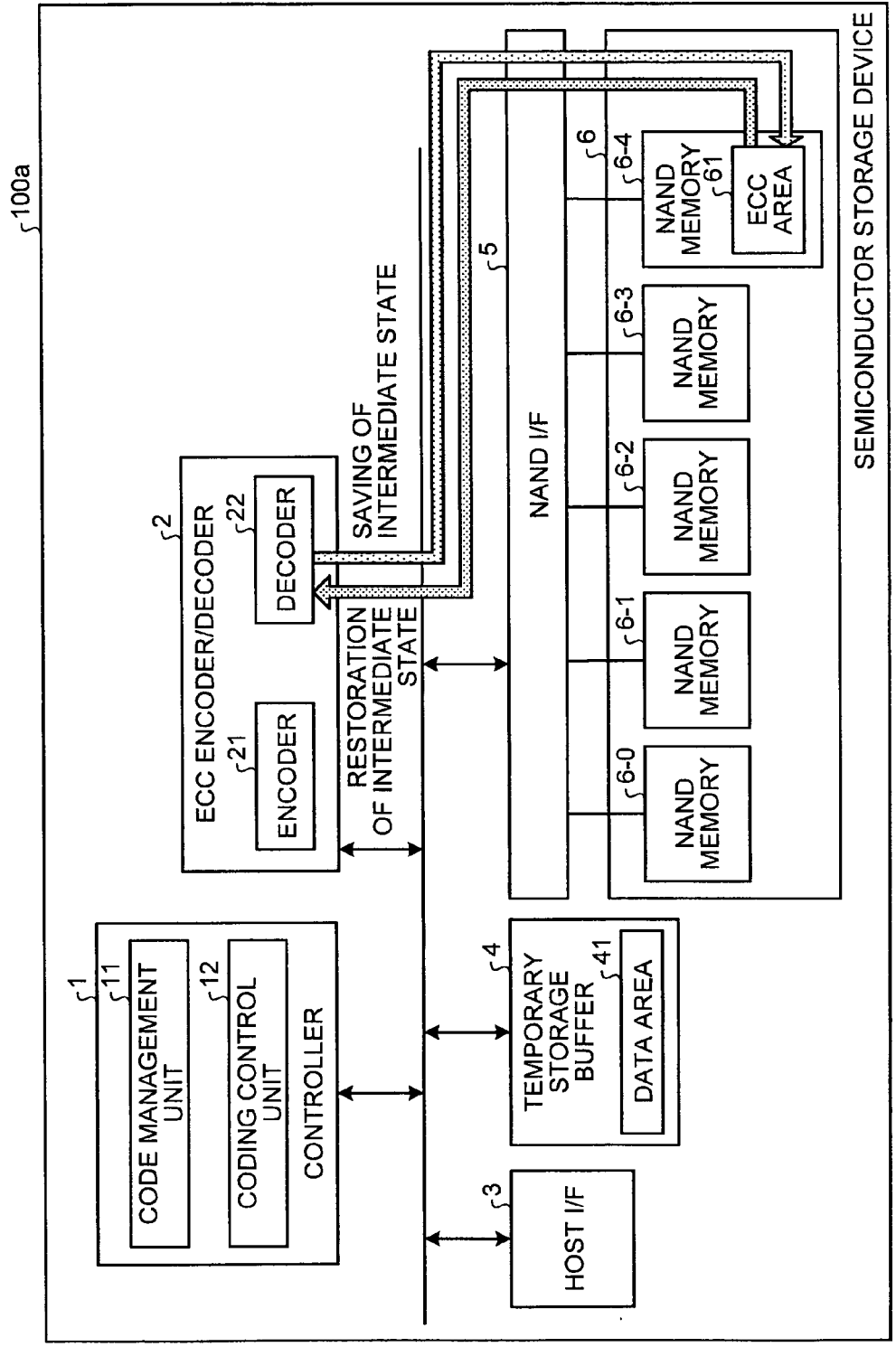
FIG. 24 is a block diagram showing a configuration example of a semiconductor storage device according to a third embodiment.

FIG. 24 is a block diagram illustrating a configuration example of a semiconductor storage device 100a according to the third embodiment. The configuration of the semiconductor storage device 100a of the present embodiment is the same as the semiconductor storage device 100 of the first embodiment, except that an ECC area 61 is provided in the NAND memory 6 instead of providing the ECC area 42 in the temporary storage buffer 4. Constituent elements having the same functions as the first embodiment will be denoted by the same reference numerals, and redundant description thereof will not be provided.

In the first embodiment, although the encoder 21 generates the error correction code using the data stored in the temporary storage buffer 4, in the present embodiment, the encoder 21 performs an error correction coding process using data stored in the data area 41 of the temporary storage buffer 4 similarly to the first embodiment. In the first embodiment, although the complete error correction code and the intermediate state of the error correction code are stored in the temporary storage buffer 4, in the present embodiment, they are directly written to the ECC area 61 of the NAND memory 6. When restoring the intermediate state of the error correction code to perform the error correction coding process, the intermediate state of the error correction code is read from the ECC area 61 of the NAND memory 6 and used for the processing.

Figure 25:
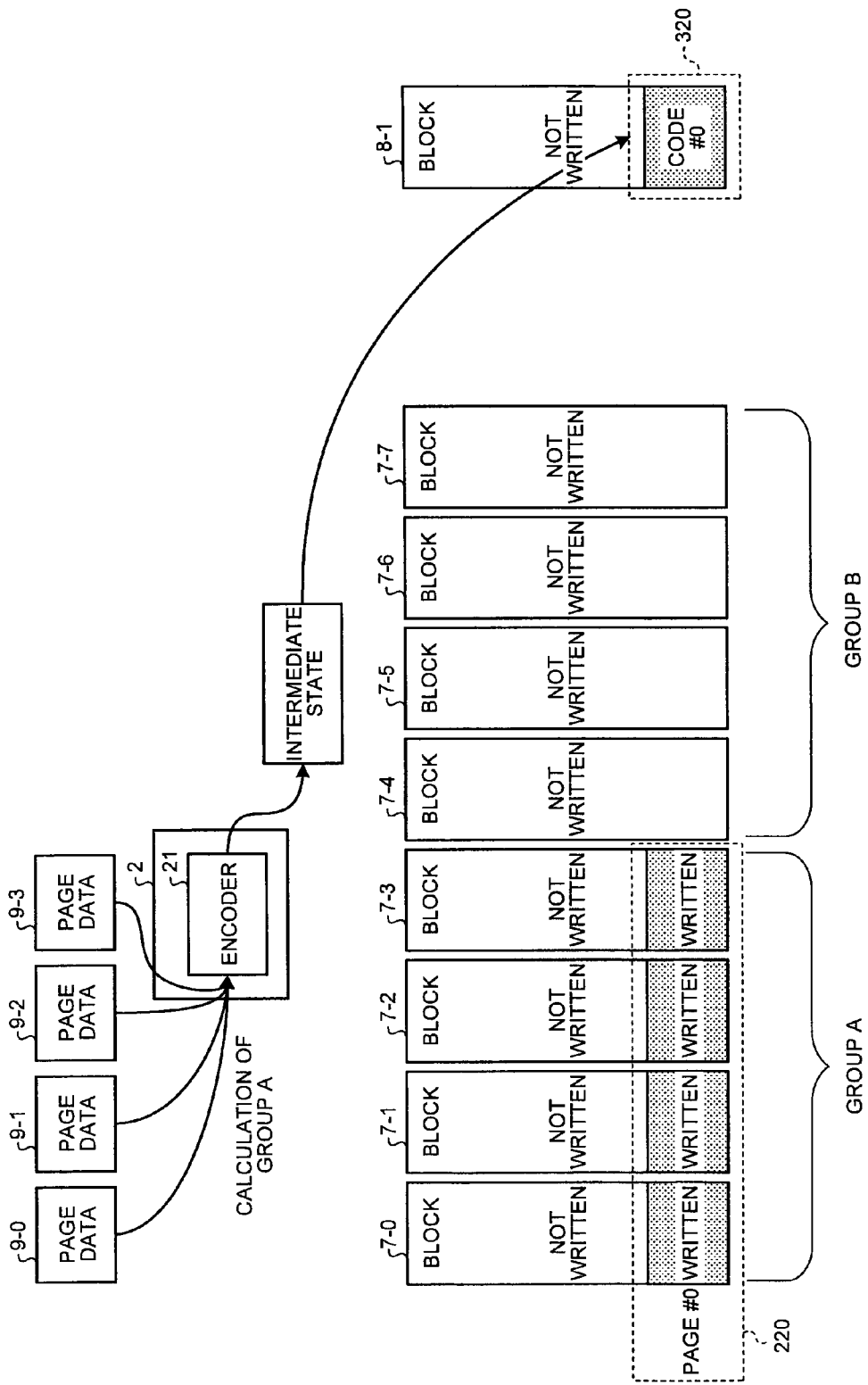
FIG. 25 is a diagram showing an example of a method of generating and storing the intermediate state of an error correction code according to the third embodiment.
Figure 26:
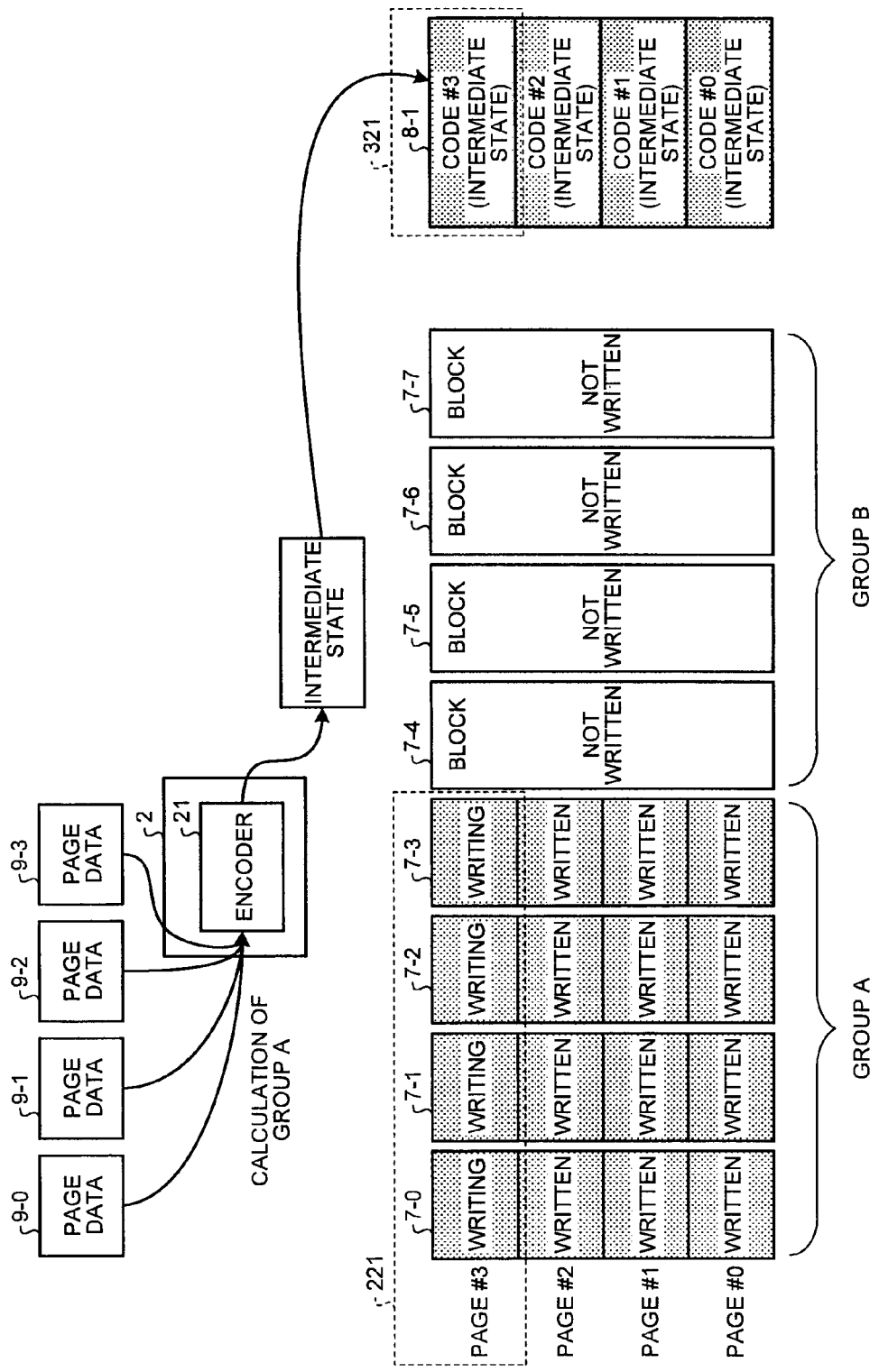
FIG. 26 is a diagram showing an example of a method of generating and storing the intermediate state of an error correction code according to the third embodiment.

FIGS. 25 and 26 are diagrams illustrating an example of a method of generating and storing the intermediate state of an error correction code according to the present embodiment. In the example shown in FIGS. 25 and 26, a complete error correction code is generated using eight blocks, the eight blocks are divided into groups (in the example of FIG. 25, the blocks are divided into the two groups A and B) similarly to the example of FIG. 5 of the first embodiment, and an error correction coding process is performed for each group.

Moreover, it is assumed that blocks 7-0 and 7-4 are blocks in the NAND memory 6-0 controlled by the channel ch0, blocks 7-1 and 7-5 are blocks in the NAND memory 6-1 controlled by the channel ch1, blocks 7-2 and 7-6 are blocks in the NAND memory 6-2 controlled by the channel ch2, and blocks 7-3 and 7-7 are blocks in the NAND memory 6-3 controlled by the channel ch3. It is also assumed that a block 8-1 is a block in the NAND memory 6-4 controlled by the channel ch4.

As shown in FIG. 25, the encoder 21 generates the intermediate state of an error correction code based on data 220 of the page #0 of each of the four blocks of the group A and writes the generated intermediate state to the ECC area 61 of the NAND memory 6 as a code #0. Similarly, codes #1, #2, and #3 which are the intermediate states of error correction codes are written based on the data of the pages #1, #2, and #3 of the group A. FIG. 26 shows the state when the code #3 is being written, in which the code #3 is generated based on data 221 and written to the NAND memory 6. The code management unit 11 manages the correspondence between the writing positions of the codes #0, #1, #2, and #3 and the writing positions of the corresponding data by a correspondence table similarly to the first embodiment. Although FIGS. 25 and 26 show an example in which each block includes the pages #0 to #3 for the sake of simplicity, the actual number of pages in a block is not limited to this.

Figure 27:
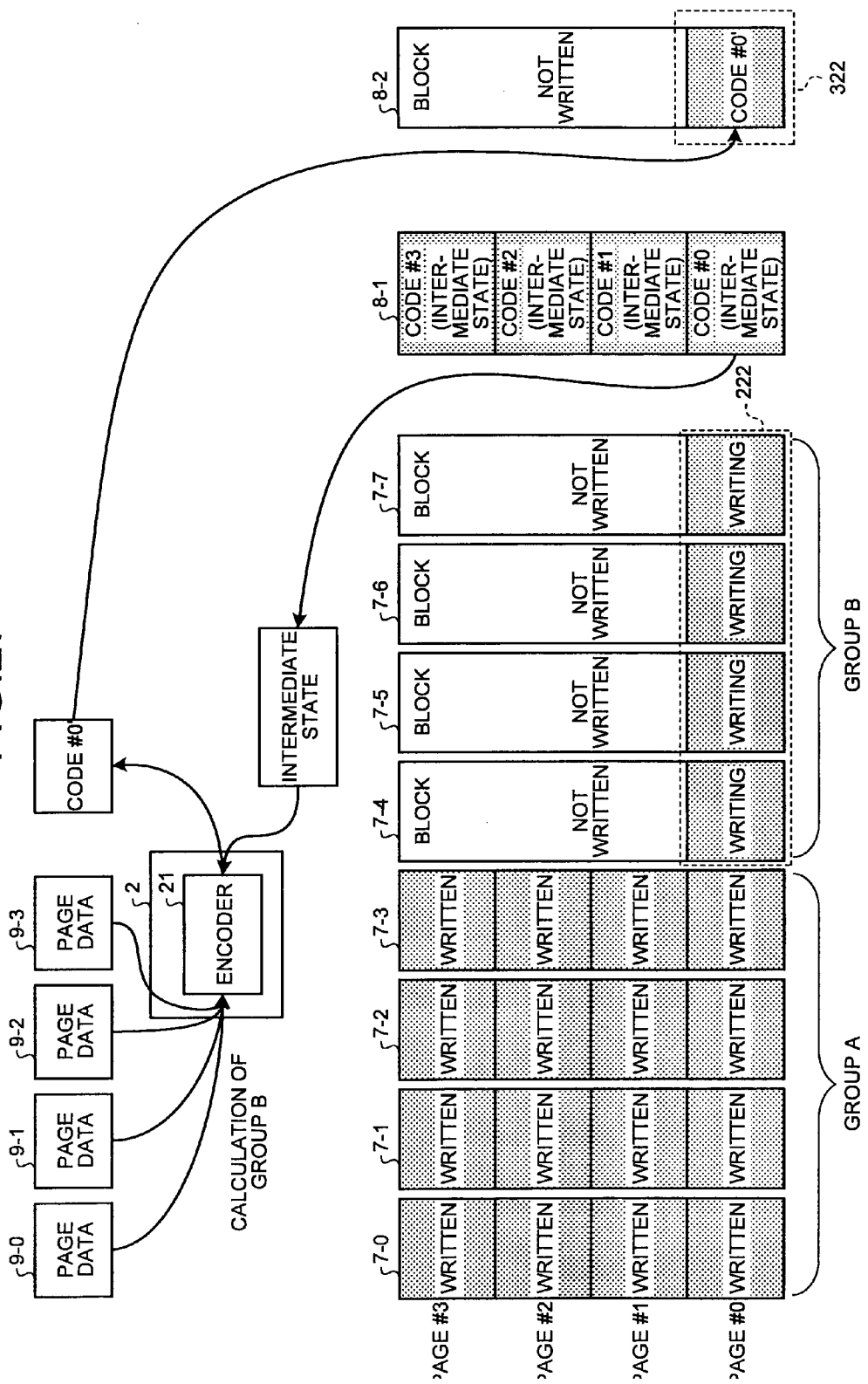
FIG. 27 is a diagram showing an example of a method of restoring and regenerating the intermediate state of an error correction code according to the third embodiment.
Figure 28:
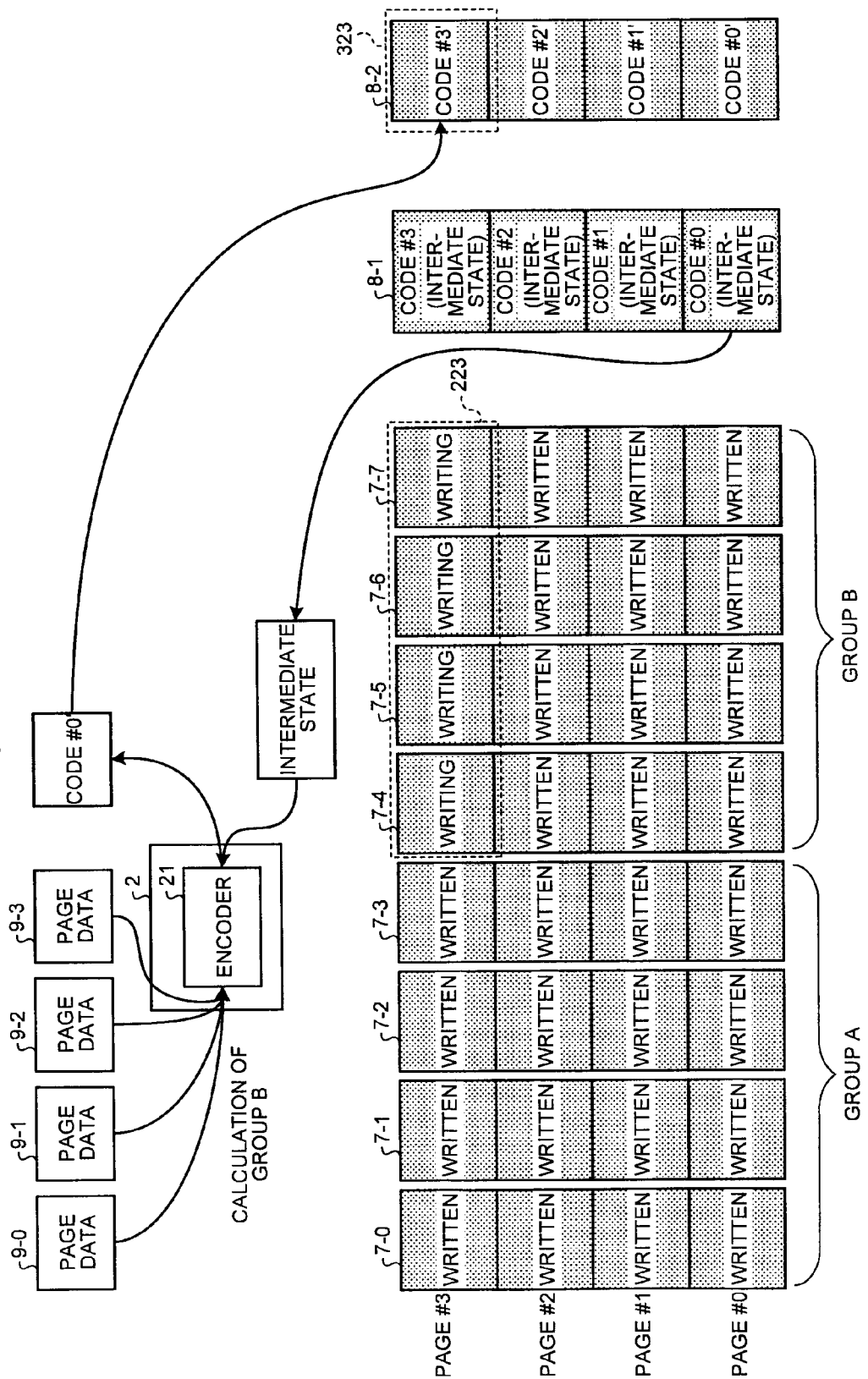
FIG. 28 is a diagram showing an example of a method of restoring and regenerating the intermediate state of an error correction code according to the third embodiment.

FIGS. 27 and 28 are diagrams illustrating an example of a method of restoring and regenerating the intermediate state of an error correction code according to the embodiment. It is assumed that a block 8-2 is a block in the NAND memory 6-4 controlled by the channel ch4. It is also assumed that as shown in FIGS. 25 and 26, the intermediate state of the error correction code generated based on the data of blocks of the group A is stored in the NAND memory 6, and writing of data to all blocks of the group A has been completed. As shown in FIG. 27, the encoder 21 reads and restores the code #0 from the NAND memory 6 (that is, sets the code #0 to the respective registers of a coding circuit), and then performs an error correction coding process using the data 222 of the page #0 of the group B to generate a code #0' (complete error correction code) and write the code #0' to the NAND memory 6. In this case, since the code #0 becomes invalid, the code management unit 11 stores the writing position of the code #0' and the writing position of the corresponding data in the correspondence table and invalidates the code #0 in the correspondence table.

Similarly, as shown in FIG. 28, the encoder 21 reads and restores the code #3 from the NAND memory 6 and then performs an error correction coding process using data 223 of the page #3 of the group B to generate a code #3' (complete error correction code) and write the code #3' to the NAND memory 6. Moreover, the code management unit 11 updates the correspondence table. When there is no valid code in the block 8-1 (all stored codes become invalid), the block 8-1 is released.

In addition, the complete error correction code and the intermediate state of the error correction code may be managed separately from each other and stored in separate areas of the NAND memory 6, and the complete error correction code and the intermediate state of the error correction code may be stored without discrimination. Moreover, in the present embodiment, since the intermediate state of the error correction code is written to the NAND memory 6, it is not necessary to perform the process of writing the intermediate state of the error correction code to the NAND memory 6 when a flash command is received and the process of periodically writing the intermediate state of the error correction code to the NAND memory 6 for the purpose of the redundancy process.

Figure 29:
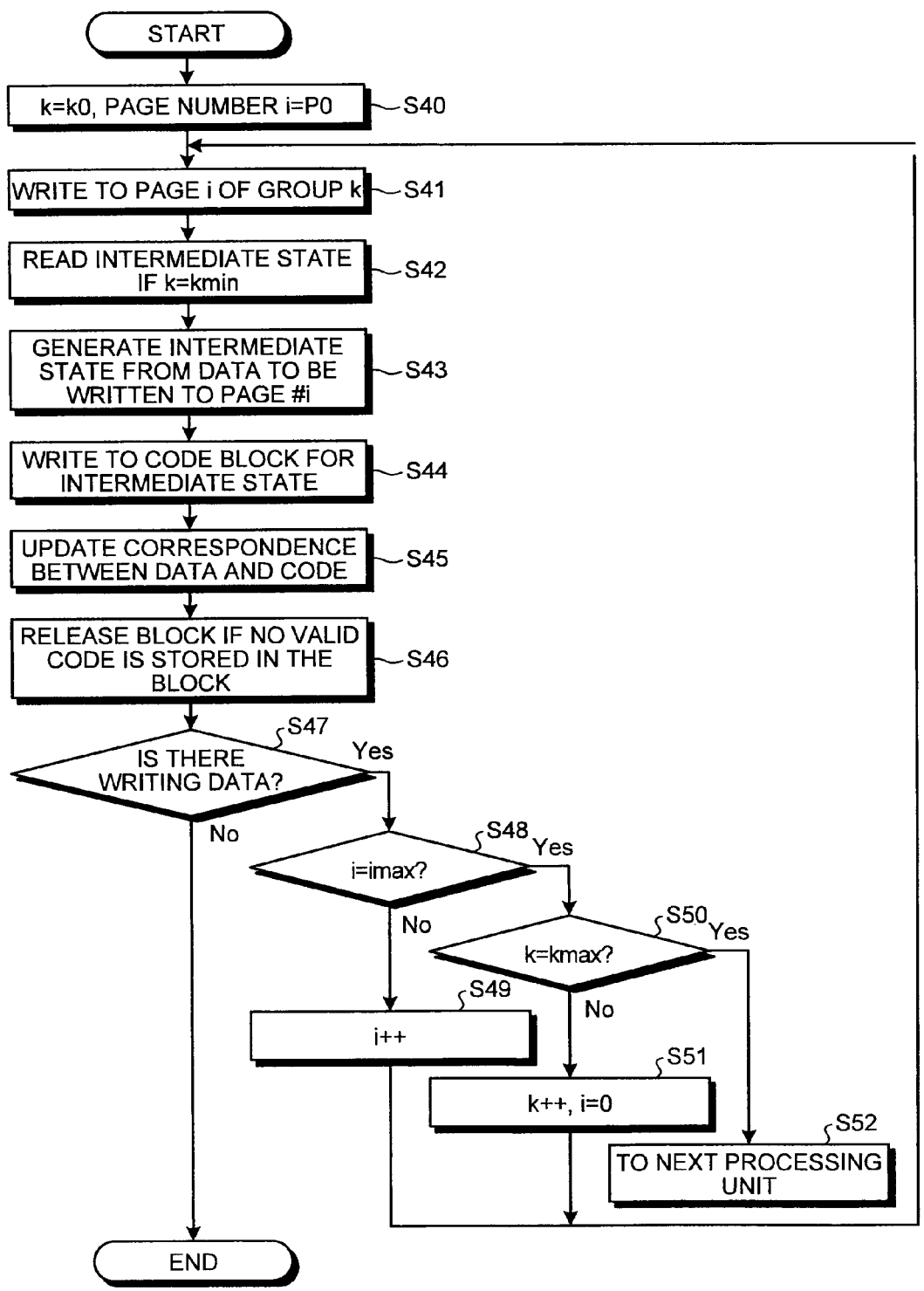
FIG. 29 is a flowchart showing an example of the procedure of operations when writing data according to the third embodiment.

FIG. 29 is a flowchart illustrating an example of the procedure of operations when writing data according to the present embodiment. In this example, it is assumed that one processing unit includes N blocks (N is an integer of 1 or more) of each chip, and writing of data to the next processing unit is performed after processing is performed within one processing unit up to a stage of writing a complete error correction code. FIG. 29 shows writing of data within one processing unit.

First, when a writing process starts, the code management unit 11 detects a group (k is a group number and k0 is a group number corresponding to a writing start position), to which the writing start position belongs, and a page (i is a page number and P0 is a page corresponding to the writing start position) of the group (step S40). The code management unit 11 instructs the NAND I/F 5 to write data to the page i of the group k of the NAND memory 6 (step S41).

When k is kmin (which is the minimum value of k, and is the group number in which the intermediate state does not need to be restored when generating an error correction code like the group A in the example of FIG. 25), the coding control unit 12 instructs the encoder 21 to initialize the coding circuit. When k is not kmin, the coding control unit 12 reads and restores the intermediate state of the corresponding error correction code from the NAND memory 6 (step S42).

When writing of data (transferring of data from the temporary storage buffer 4 to the NAND memory 6) starts, the coding control unit 12 instructs the encoder 21 to start an error correction coding process, and the encoder 21 generates the intermediate state (or the complete error correction code) of the error correction code using the writing data being transferred based on the instruction (step S43). The code management unit 11 instructs the NAND I/F 5 so as to write the generated intermediate state (or the complete error correction code) to the ECC area 61 of the NAND memory 6-4 (step S44) and updates the correspondence table based on the writing position of data and the writing position of the intermediate state (step S45).

Subsequently, the code management unit 11 determines whether there is writing data (step S47). When there is no writing data (No in step S47), the process ends. When there is writing data (Yes in step S47), it is determined whether i is imax (the maximum page number in a block) (step S48). When i≠imax (No in step S48), i is incremented by 1 (step S49), and the flow returns to step S41. When i=imax (Yes in step S48), it is determined whether k is kmax (maximum group number) (step S50). When k≠kmax (No in step S50), k is incremented by 1 and i is set to 0 (step S51). Then, the flow returns to step S41.

When k=kmax (Yes in step S50), writing of data within the processing unit ends, and the flow proceeds to a process of writing to the next processing unit (step S52).

When no flash command is received or no abnormal power-off or the like occurs during the processing, a complete error correction code corresponding to the data written to the NAND memory 6 is stored in the NAND memory 6. The decoding process of this case is the same as that of the related art. Moreover, the decoding process performed when a flash command is received or an abnormal power-off or the like occurs during processing is the same as the decoding process performed after the intermediate state is written in response to a flash command in the first embodiment or the decoding process performed after an abnormal power-off occurs in the second embodiment. The operation of the present embodiment other than the operations described above is the same as the first embodiment.

As described above, in the present embodiment, the encoder 21 does not write the intermediate state of a generated error correction code to the temporary storage buffer 4 but writes the intermediate state directly to the NAND memory 6. Thus, it is possible to decrease the capacity of the temporary storage buffer 4 and to decrease the cost as compared to the first embodiment.

Fourth Embodiment

Figure 30:
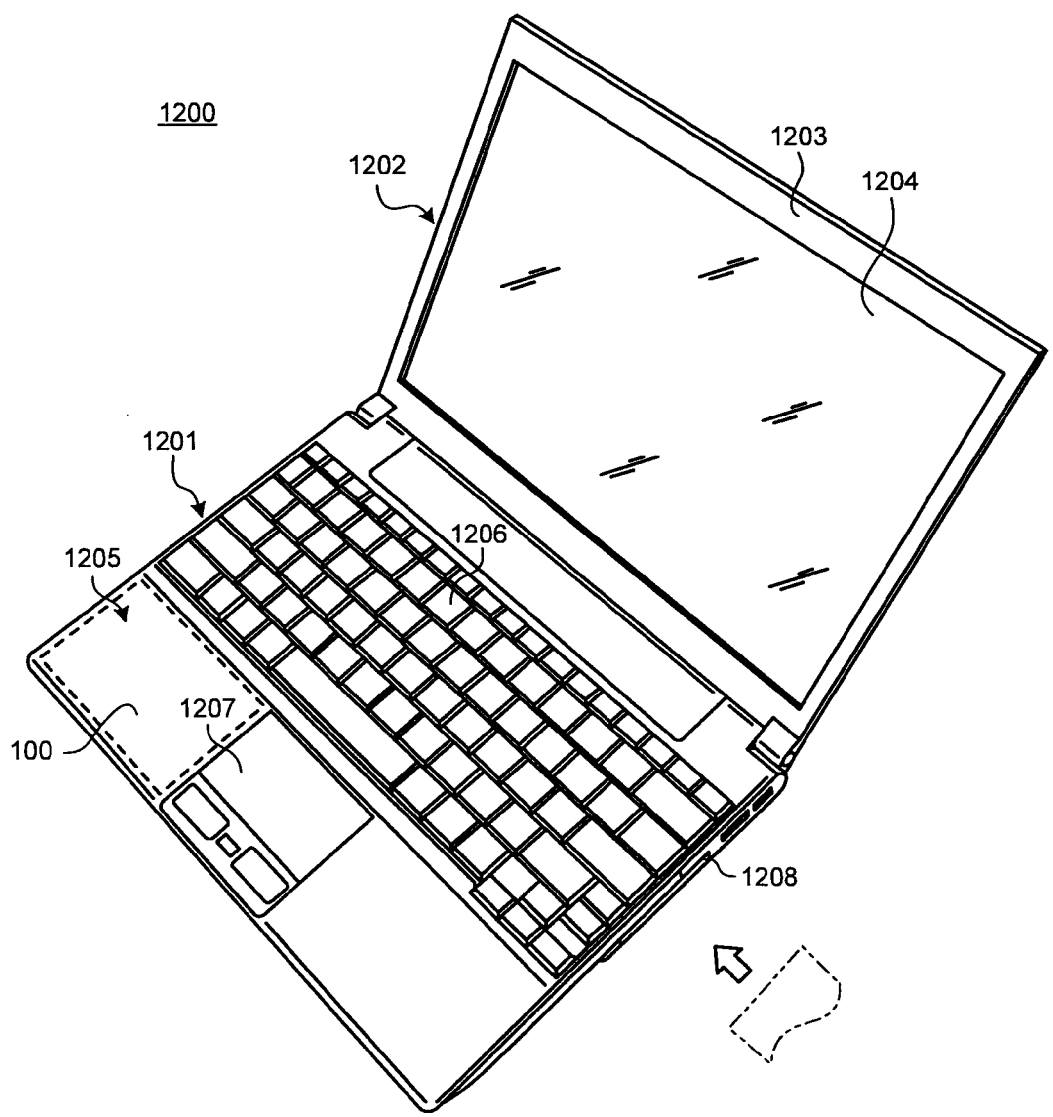
FIG. 30 is a perspective view showing the exterior view of a personal computer.

FIG. 30 is a perspective view illustrating an example of a personal computer 1200 having the SSD 100 mounted thereon. The personal computer 1200 has a main body 1201 and a display unit 1202. The display unit 1202 includes a display housing 1203 and a display device 1204 accommodated in the display housing 1203.

The main body 1201 includes a casing 1205, a keyboard 1206 and a touch pad 1207 which is a pointing device. In the casing 1205, a main circuit board, an ODD (Optical Disk Device) unit, a card slot, the SSD 100 and the like are accommodated.

The card slot is provided adjacent to the peripheral wall of the casing 1205. In the peripheral wall, an opening 1208 facing the card slot is formed. The user can insert and remove an additional device into/from the card slot from the exterior of the casing 1205 through the opening 1208.

The SSD 100 may be mounted on the internal portion of the personal computer 1200 and used as a replacement of the conventional HDD and may be inserted into the card slot of the personal computer 1200 and used as an additional device.

Figure 31:
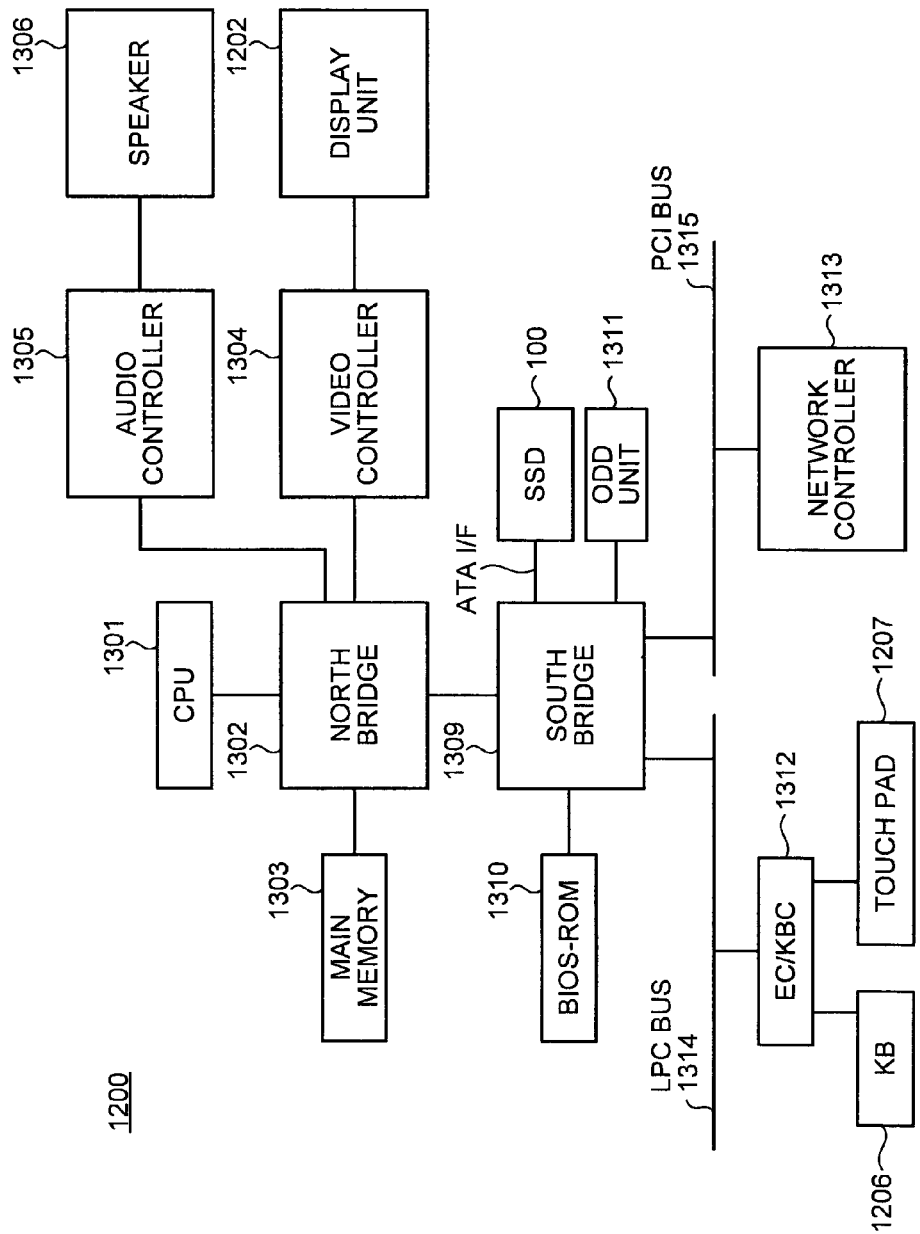
FIG. 31 is a diagram showing a functional configuration example of the personal computer.

FIG. 31 shows an example of a system configuration of a personal computer having the SSD 100 mounted thereon. The personal computer 1200 includes a CPU 1301, a north bridge 1302, a main memory 1303, a video controller 1304, an audio controller 1305, a south bridge 1309, a BIOS-ROM 1310, the SSD 100, an ODD unit 1311, an embedded controller/keyboard controller IC (EC/KBC) 1312, a network controller 1313, and the like.

The CPU 1301 is a processor used for controlling the operation of the personal computer 1200, and executes the operating system (OS) loaded in the main memory 1303 from the SSD 100. When the ODD unit 1311 enables at least one of a read process and a write process to be executed for the loaded optical disk, the CPU 1301 executes the process.

Moreover, the CPU 1301 also executes the system BIOS (Basic Input Output System) stored in the BIOS-ROM 1310. The system BIOS is a program used for controlling the hardware components in the personal computer 1200.

The north bridge 1302 is a bridge device for connecting the local bus of CPU 1301 and the south bridge 1309. The north bridge 1302 incorporates a memory controller used for controlling the access to the main memory 1303.

The north bridge 1302 also has a function of executing communications with the video controller 1304 and the audio controller 1305 by way of an AGP (Accelerated Graphics Port) bus.

The main memory 1303 temporarily stores programs and data and functions as a work area of CPU 1301. The main memory 1303 is made of a RAM, for example.

The video controller 1304 is a video reproduction controller used for controlling a display unit 1202 which is used as a display monitor of the personal computer 1200.

The audio controller 1305 is an audio reproduction controller used for controlling the speaker 1306 of the personal computer 1200.

The south bridge 1309 controls the respective devices on an LPC (Low Pin Count) bus 1314 and the respective devices on a PCI (Peripheral Component Interconnect) bus 1315. Moreover, the south bridge 1309 controls the SSD 100, which is a storage device used for storing various kinds of software and data, through an ATA interface.

The personal computer 1200 accesses the SSD 100 in units of sectors. A write command, a read command, a cache flash command, and the like are supplied to the SSD 100 through the ATA interface.

The south bridge 1309 also has a function of controlling the access to the BIOS-ROM 1310 and the ODD unit 1311.

The EC/KBC 1312 is a one-chip microcomputer in which an embedded controller for performing power management and a keyboard controller for controlling a keyboard (KB) 1206 and a touch pad 1207 are integrated.

The EC/KBC 1312 has a function of turning ON or OFF the personal computer 1200 in accordance with the user operation on a power button. The network controller 1313 is a communication device that performs communications with an external network such as, for example, the Internet.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
   a nonvolatile semiconductor memory;
   a temporary storage buffer that temporarily stores a first data having a predetermined size, the first data being composed of a plurality of pieces of divided data;
   a coding processing unit that performs a first error correction coding process based on a second data which is one of the plurality of pieces of divided data, writes a redundancy data obtained by the first error correction coding process to the temporary storage buffer, performs a second error correction coding process based on the redundancy data read from the temporary storage buffer and another one of the plurality of pieces of divided data, performs write processing for writing the redundancy data obtained by the second error correction coding process and performs a subsequent error correction coding process and a subsequent write processing until the error correction coding process is finished for all of the plurality of pieces of divided data; and
   a memory interface that writes, to the nonvolatile semiconductor memory, the first data and the redundancy data obtained as a result of the error correction coding process after the error correction coding process is finished for all of the plurality pieces of divided data.

2. The semiconductor storage device according to claim 1, further comprising:
   a decoding processing unit that performs a decoding process based on the first data and the redundancy data read from the nonvolatile semiconductor memory; and
   a control unit that causes the memory interface to write the redundancy data to the nonvolatile semiconductor memory as an intermediate code when a command instructing to make preparation for a power-off is received before the error correction coding process is completed for all of the plural pieces of divided data, stores correspondence between a storage position in the nonvolatile semiconductor memory of the intermediate code and the storage position of the divided data corresponding to the intermediate code, and causes the memory interface to read the intermediate code and the divided data corresponding to the intermediate code,
   wherein the decoding processing unit performs the decoding process based on the intermediate code and the divided data corresponding to the intermediate code, read from the nonvolatile semiconductor memory.

3. The semiconductor storage device according to claim 2, wherein when a plurality of intermediate codes generated based on divided data forming the first data are stored in the nonvolatile semiconductor memory, the control unit validates a most recently stored intermediate code among the plurality of intermediate codes and causes the memory interface to read the valid intermediate code for use in the decoding process.

4. The semiconductor storage device according to claim 2, wherein the nonvolatile semiconductor memory includes a code area configured to store the redundancy data obtained by the second or a subsequent error correction coding process after the error correction coding process is finished for all of the plurality pieces of divided data, and wherein the control unit causes the memory interface to write the intermediate code to the code area.

5. The semiconductor storage device according to claim 2, wherein the nonvolatile semiconductor memory includes a code area configured to store the redundancy data obtained by a most recently completed error correction coding process after the error correction coding process is finished for all of the plurality pieces of divided data, and wherein the control unit causes the memory interface to write the intermediate code to the data area.

6. The semiconductor storage device according to claim 2, wherein, when a plurality of intermediate codes generated based on divided data forming the first data are stored in first areas of the nonvolatile semiconductor memory, a most recently stored intermediate code among the plurality of intermediate codes is written in a second area of the nonvolatile semiconductor memory, and the first areas are released.

7. The semiconductor storage device according to claim 1, wherein a control unit causes the memory interface to write the first data of which a corresponding complete error correction code is not stored in the nonvolatile semiconductor memory to the nonvolatile semiconductor memory in multiple areas, and causes the memory interface to release areas of the multiple areas excluding one area when the complete error correction code has been written, the complete error correction being the redundancy data obtained by the latest error correction coding process after the error correction coding process is finished for all of the plurality pieces of divided data.

8. The semiconductor storage device according to claim 2, wherein, when an amount of at least one piece of first data of which the redundancy data has not been written to the nonvolatile semiconductor memory is equal to or larger than a predetermined threshold value, the control unit causes the memory interface to write the intermediate code corresponding to the at least one piece of first data to the nonvolatile semiconductor memory.

9. A semiconductor storage device comprising:
a nonvolatile semiconductor memory;
a temporary storage buffer that temporarily stores a first data having a predetermined size, the first data being composed of a plurality of pieces of divided data;
a coding processing unit that performs an error correction coding process based on a second data which is one of the plurality of pieces of divided data which are being transferred from the temporary storage buffer to the nonvolatile semiconductor memory; and
a memory interface that writes redundancy data obtained by the error correction coding process to the nonvolatile semiconductor memory, reads an intermediate code from the nonvolatile semiconductor memory, and inputs the redundancy data to the coding processing unit,
wherein the coding processing unit performs a second error correction coding process based on the redundancy data read from the nonvolatile semiconductor memory and another one of the plurality of pieces of divided data which are being transferred from the temporary storage buffer to the nonvolatile semiconductor memory,
the memory interface performs write processing for writing the redundancy data obtained by the second error correction coding process, and the semiconductor storage device performs a subsequent error correction coding process and writing redundancy data until the error correction coding process is finished for all of the plurality of pieces of divided data.

10. The semiconductor storage device according to claim 9,
wherein, when a plurality of pieces of the redundancy data generated based on divided data forming the first data are stored in first areas of the semiconductor memory, the redundancy data obtained by the second or a subsequent error correction coding process is stored in a second area of the nonvolatile semiconductor memory, and the first areas are released.

11. The semiconductor storage device according to claim 9,
wherein the nonvolatile semiconductor memory includes a plurality of blocks, and
the divided data is stored in two or more blocks.

12. The semiconductor storage device according to claim 9,
wherein the nonvolatile semiconductor memory includes a plurality of memory areas each capable of operating independently,
the memory interface enables data to be independently written to the plurality of memory areas,
each of the plurality of memory areas includes one or more blocks, and each block includes one or more pages, and
the divided data is stored in two or more blocks belonging to different memory areas.

13. The semiconductor storage device according to claim 12,
wherein the memory interface and the coding processing unit perform the error correction coding process corresponding to the divided data and the writing of the divided data to the nonvolatile semiconductor memory in parallel.

14. The semiconductor storage device according to claim 12,
wherein the first data is stored in pages having a same page number in different blocks.

15. The semiconductor storage device according to claim 14,
wherein writing of data to the nonvolatile semiconductor memory is controlled in units of the divided data, the divided data including data belonging to a same block are written to the nonvolatile semiconductor memory in order of page number, and after writing of data to all pages in the same block is completed, writing of data to a block corresponding to the divided data including data of a block other than the same block is performed.

16. The semiconductor storage device according to claim 12,
wherein the first data is stored in pages having different page numbers in of different blocks.

17. The semiconductor storage device according to claim 16,
wherein the first data is stored to pages that are robust to errors and pages that are vulnerable to errors.

18. A method of controlling a semiconductor storage device including a nonvolatile semiconductor memory, comprising:
temporarily storing a first data having a predetermined size, the first data being composed of a plurality of pieces of divided data;
performing a first error correction coding process based on a second data which is one of the plurality of pieces of divided data, and writing a redundancy data obtained by the first error correction coding process to a temporary storage buffer;

performing a second error correction coding process based on the redundancy data read from the temporary storage buffer and another one of the plurality of pieces of divided data;

performing a write processing for writing the redundancy data obtained by the second error correction coding process;

performing a subsequent error correction coding process and performing a subsequent write processing until the error correction coding process is finished for all of the plurality of pieces of divided data; and writing, to the nonvolatile semiconductor memory, the first data and the redundancy data obtained as a result of the error correction coding process after the error correction coding process is finished for all of the plurality pieces of divided data.

* * * * *